United States Patent
Yamazaki et al.

(10) Patent No.: US 8,557,676 B2
(45) Date of Patent: Oct. 15, 2013

(54) METHOD OF MANUFACTURING SOI SUBSTRATE AND METHOD OF MANUFACTURING SEMICONDUCTOR DEVICE

(75) Inventors: Shunpei Yamazaki, Setagaya (JP); Hideto Ohnuma, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/986,582

(22) Filed: Jan. 7, 2011

(65) Prior Publication Data

US 2011/0097872 A1 Apr. 28, 2011

Related U.S. Application Data

(62) Division of application No. 12/076,691, filed on Mar. 21, 2008, now Pat. No. 7,902,034.

(30) Foreign Application Priority Data

Apr. 25, 2007 (JP) ................... 2007-115993

(51) Int. Cl.
*H01L 21/20* (2006.01)
(52) U.S. Cl.
CPC .................... *H01L 21/2007* (2013.01)
USPC ............ 438/406; 438/479; 257/E21.002; 257/E21.598
(58) Field of Classification Search
USPC ................................... 438/479, 406
See application file for complete search history.

(56) References Cited

U.S. PATENT DOCUMENTS

| 5,374,564 A | 12/1994 | Bruel |
| 6,127,702 A | 10/2000 | Yamazaki et al. |

(Continued)

FOREIGN PATENT DOCUMENTS

| EP | 0961312 A | 12/1999 |
| JP | 08-255762 A | 10/1996 |

(Continued)

OTHER PUBLICATIONS

Sullivan et al., "P-220L: Late-News Poster: Layer-Transfer of Silicon Single-Crystal Films on Large-Area Glass Substrates for Mobile Display Applications," SID Digest '06: SID International Symposium Digest of Technical Papers, 2006, pp. 280-282.

*Primary Examiner* — Ajay K Arora
(74) *Attorney, Agent, or Firm* — Eric J. Robinson; Robinson Intellectual Property Law Office, P.C.

(57) ABSTRACT

A first substrate of single-crystal silicon within which is formed an embrittled layer and over a surface of which is formed a first insulating film is provided; a second insulating film is formed over a surface of a second substrate; at least one surface of either the first insulating film or the second insulating film is exposed to a plasma atmosphere or an ion atmosphere, and that surface of the first insulating film or the second insulating film is activated; the first substrate and the second substrate are bonded together with the first insulating film and the second insulating film interposed therebetween; a single-crystal silicon film is separated from the first substrate at an interface of the embrittled layer of the first substrate, and a thin film single-crystal silicon film is formed over the second substrate with the first insulating film and the second insulating film interposed therebetween.

36 Claims, 15 Drawing Sheets

(56) References Cited

U.S. PATENT DOCUMENTS

| | | | |
|---|---|---|---|
| 6,168,980 B1 | 1/2001 | Yamazaki et al. | |
| 6,180,496 B1 * | 1/2001 | Farrens et al. | 438/455 |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,613,678 B1 | 9/2003 | Sakaguchi et al. | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,890,838 B2 | 5/2005 | Henley et al. | |
| 6,936,844 B1 * | 8/2005 | Yamazaki et al. | 257/59 |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,419,884 B2 | 9/2008 | Kerdiles | |
| 7,473,971 B2 | 1/2009 | Yamazaki et al. | |
| 7,476,576 B2 | 1/2009 | Yamazaki et al. | |
| 7,535,053 B2 | 5/2009 | Yamazaki | |
| 2001/0014496 A1 * | 8/2001 | Zhang et al. | 438/197 |
| 2001/0019153 A1 * | 9/2001 | Sato et al. | 257/347 |
| 2002/0001899 A1 * | 1/2002 | Ito | 438/231 |
| 2003/0170990 A1 | 9/2003 | Sakaguchi et al. | |
| 2003/0186484 A1 * | 10/2003 | Saijo et al. | 438/106 |
| 2004/0097055 A1 * | 5/2004 | Henley et al. | 438/471 |
| 2005/0074954 A1 * | 4/2005 | Yamanaka | 438/458 |
| 2007/0108510 A1 | 5/2007 | Fukunaga | |
| 2007/0110917 A1 * | 5/2007 | Okada | 427/532 |
| 2007/0173000 A1 | 7/2007 | Yamazaki | |
| 2007/0281399 A1 * | 12/2007 | Cites et al. | 438/149 |
| 2007/0291022 A1 | 12/2007 | Yamazaki et al. | |

FOREIGN PATENT DOCUMENTS

| | | |
|---|---|---|
| JP | 2000-036583 A | 2/2000 |
| JP | 2004-320050 | 11/2004 |
| JP | 2005-294800 A | 10/2005 |
| JP | 2006-324530 A | 11/2006 |

\* cited by examiner

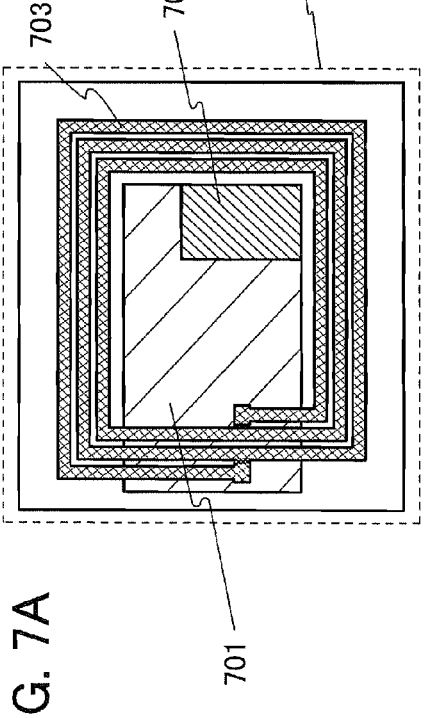
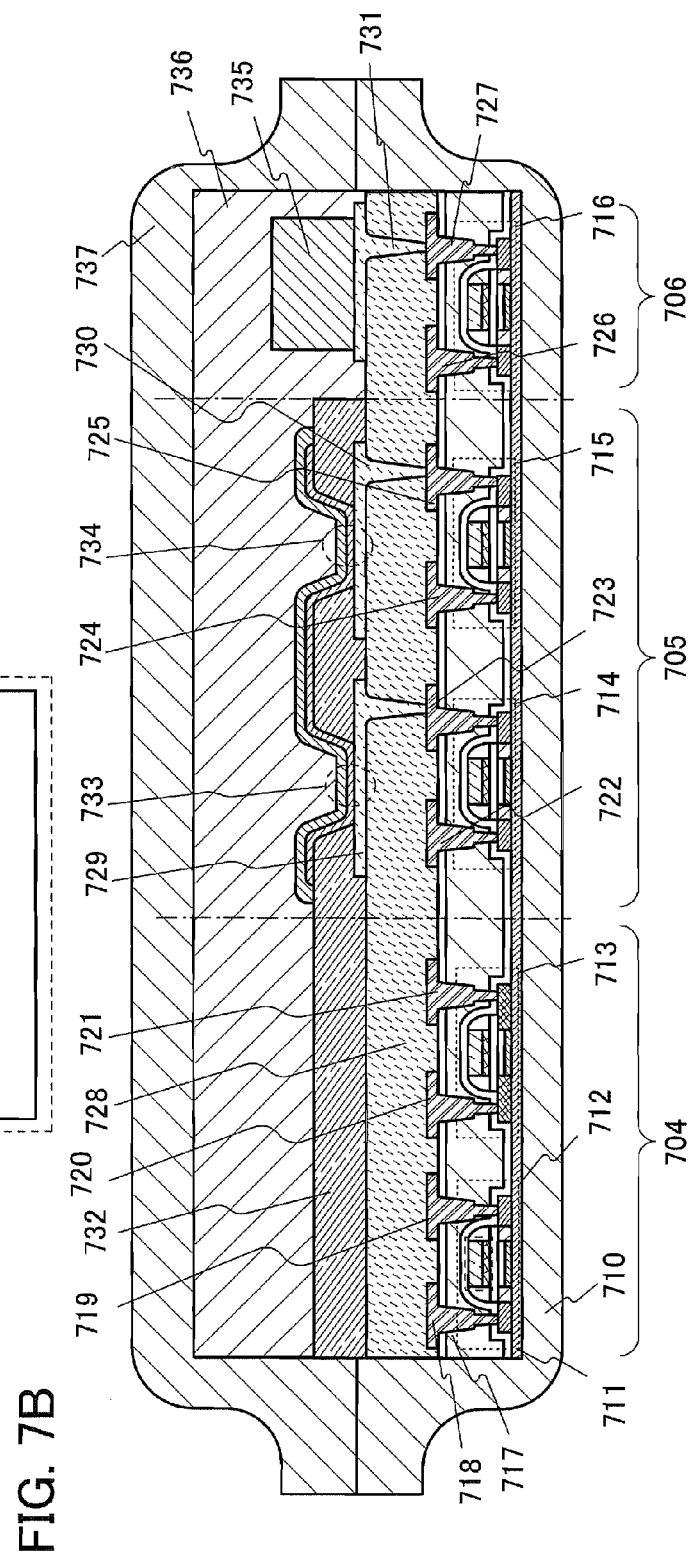

FIG. 15

| Accelerating voltage | Ratio of hydrogen atom (X:Y) | Ratio of hydrogen ion species (X:Y/3) |
|---|---|---|
| 80kV | 1:44.1 | 1:14.7 |
| 60kV | 1:42.5 | 1:14.2 |
| 40kV | 1:43.5 | 1:14.5 |

METHOD OF MANUFACTURING SOI SUBSTRATE AND METHOD OF MANUFACTURING SEMICONDUCTOR DEVICE

BACKGROUND OF THE INVENTION

1. Field of the Invention

The present invention relates to methods of manufacturing SOI substrates, semiconductor devices formed using the SOI substrates, and methods of manufacturing the semiconductor devices. It is to be noted that "semiconductor device" in the present specification refers to general devices that can function by use of semiconductor characteristics.

2. Description of the Related Art

A variety of research related to silicon on insulator (SOI) technology is being conducted because integrated circuits that are fabricated using SOI substrates formed of a single-crystal silicon film over an insulating surface have advantages that cannot be obtained with integrated circuits that are fabricated using bulk silicon substrates.

For SOI technology, for example, separation by implanted oxygen (SIMOX) technology by which oxygen is implanted in a single-crystal silicon substrate by ion implantation to form a buried oxide layer; bonding SOI technology by which two silicon substrates are bonded together with a silicon oxide film interposed therebetween; ELTRAN (registered trademark) technology in which selective etching of a porous silicon layer is used; and the like have been disclosed.

Of these technologies, bonding SOI technology has been attracting attention because therewith an SOI layer with high crystallinity can easily be formed over substrates other than silicon substrates (quartz substrates, ceramic substrates, and the like, for example). However, in fabrication of a bonding SOI substrate, there are problems in that deterioration in quality due to contamination of the SOI layer, warping of the substrate, and the like occur, which adversely affects device characteristics.

Thus, for solving these kinds of problems, technology for fabrication of bonding SOI substrates, by which two wafers are directly bonded together, has been proposed (for example, in Patent Document 1: Japanese Published Patent Application No. 2004-320050). In Patent Document 1, a method of fabricating an SOI substrate has been disclosed, in which, after a substrate in which a silicon oxide layer, a silicon nitride layer, and a polycrystalline silicon layer are stacked over a single-crystal silicon layer in the order given, and a support substrate, which is provided separately, are washed with a solution and the surface of each of the substrate and the support substrate is activated; the two wafers are directly bonded to each other; and heat treatment is performed to bond the substrate and the support substrate together so that an SOI substrate is formed by grinding and polishing of the single-crystal silicon film that is to be an active layer.

SUMMARY OF THE INVENTION

However, with conventional methods, there is a need for heat treatment to be performed at a high temperature of from 800° C. to 1100° C. in bonding of the two substrates together; a substrate with a high resistance to heat, such as a silicon substrate or the like, must be used for the support substrate; and there is a problem of an increase in fabrication costs. Furthermore, with conventional methods, because a thin film single-crystal silicon film is fabricated by grinding and polishing of a single-crystal silicon film, there are problems in that controlling film thickness and controlling the uniformity of film thickness are both difficult.

The invention of the present application is technology used to solve these kinds of problems, and an object of the present invention is to provide a method for fabrication of an SOI substrate with a high level of adhesiveness without any high-temperature heat treatment being performed in the bonding of substrates. Another object of the present invention is to provide a semiconductor device in which the SOI substrate is used and a manufacturing method for the semiconductor device.

One aspect of the present invention is an SOI substrate that can be fabricated by steps of providing a first substrate that is a single-crystal silicon substrate within which is formed an embrittled layer and over a surface of which is formed a first insulating film; forming a second insulating film over a second substrate; exposing a surface of at least one of the first insulating film and the second insulating film to a plasma atmosphere or an ion atmosphere and activating the surface of the first insulating film or the second insulating film; bonding the first substrate and the second substrate together with the first insulating film and the second insulating film interposed therebetween; and separating a single-crystal silicon film from the first substrate at an interface of the embrittled layer of the first substrate and forming a thin film single-crystal silicon film over the second substrate with the first insulating film and the second insulating film interposed therebetween. It is to be noted that the first insulating film and the second insulating film need not necessarily be provided.

Another aspect of the present invention is a semiconductor device that can be fabricated by steps of providing a first substrate that is a single-crystal silicon substrate within which is formed an embrittled layer and over a surface of which is formed a first insulating film; forming a second insulating film over a second substrate; exposing at least one surface of either the first insulating film or the second insulating film to a plasma atmosphere or an ion atmosphere and activating the surface of the first insulating film or the second insulating film; bonding the first substrate and the second substrate together with the first insulating film and the second insulating film interposed therebetween; separating a single-crystal silicon film from the first substrate at an interface of the embrittled layer of the first substrate and forming a thin film single-crystal silicon film over the second substrate with the first insulating film and the second insulating film interposed therebetween; forming a third insulating film over the thin film single-crystal silicon film; forming a gate electrode over the third insulating film; introducing an impurity element into the thin film single-crystal silicon film using the gate electrode as a mask; forming a fourth insulating film over the gate electrode; and forming a contact hole in the fourth insulating film that reaches the thin film single-crystal silicon film and forming a conductive film over the fourth insulating film that is electrically connected to the thin film single-crystal film through the contact hole. It is to be noted that the first insulating film and the second insulating film need not necessarily be provided.

It is to be noted that, for the gas used during exposure to the plasma atmosphere, a gas of a single element of oxygen, nitrogen, or hydrogen; a halogen gas; a noble gas; a compound gas of any compound except for a silane-based compound; a molecular gas such as ammonia; or a mixed gas of any of these gases can be used.

It is to be noted that ions having an energy greater than or equal to 20 eV and less than 200 eV can be used during exposure to the ion atmosphere.

In the present invention, because a bonding force used to bond substrates together is applied to the surfaces of the substrates so that the two substrates are superimposed on top of each other, strong bonding can be achieved without any high temperature heat treatment being performed. Consequently, there is no need to use an expensive substrate that has a high resistance to heat, and thus, an inexpensive glass substrate, a plastic substrate, or the like can be used, and a reduction in fabrication costs can be achieved. Furthermore, by use of a silicon film that contains oxygen or nitrogen as an insulating film interposed between the support substrate and the single-crystal silicon film, contamination of impurities from the substrate into the single-crystal silicon film can be prevented.

BRIEF DESCRIPTION OF THE DRAWINGS

FIGS. 7A and 7B are diagrams illustrating a structure of a semiconductor device in accordance with an Embodiment Mode of the present invention that is capable of wireless communication.

FIG. 15 is a table of ratios (elemental hydrogen ratios and ionic hydrogen ratios) of fitting parameters.

DETAILED DESCRIPTION OF THE INVENTION

Figure 1A:
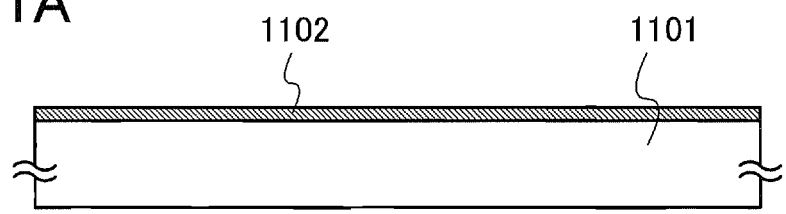
FIGS. 1A to 1C are diagrams used to describe a method of manufacturing an SOI substrate in accordance with an Embodiment Mode of the present invention.

Embodiment Modes of the present invention will be described hereinafter with reference to the accompanying drawings. However, the present invention is not limited to the description given hereinafter, and it is to be easily understood to those skilled in the art that various changes and modifications can be made without any departure from the spirit and scope of the present invention. Therefore, the present invention is not to be construed as being limited to the description of the embodiment modes given hereinafter. It is to be noted that, in structures of the present invention described below, there are cases in which the same reference numerals are used in common to denote the same components in different drawings.

Embodiment Mode 1

In the present embodiment mode, a method of fabrication of a single-crystal semiconductor thin film over a glass substrate with an insulating film interposed between the single-crystal semiconductor thin film and the glass substrate will be described using FIGS. 1A to 1C.

First, a single-crystal silicon substrate 1101 is prepared (FIG. 1A). It is to be noted that the substrate used is not limited to being a single-crystal silicon substrate, and a single-crystal silicon-germanium substrate or the like may be used, as well.

Next, a silicon oxide film that contains nitrogen (a silicon oxynitride film) 1102 is formed over a surface of the single-crystal silicon substrate 1101 (FIG. 1A). The film thickness should be selected as appropriate by a practitioner and may be set to be from 10 nm to 500 nm (preferably, from 20 nm to 100 nm). The silicon oxynitride film 1102 functions as a part of an insulating film of an SOI substrate that is to be formed later. It is to be noted that the silicon oxynitride film 1102 can be formed using a method such as a CVD method such as a plasma CVD method, a low-pressure CVD method, or the like; a sputtering method; or the like. It is to be noted that the silicon oxynitride film 1102 can be formed over the surface of the single-crystal silicon substrate 1101 by treatment of the surface of the single-crystal silicon substrate with oxygen radicals (there are cases where this includes OH radicals, as well) that are generated by plasma discharge under a gas atmosphere that contains oxygen and then by treatment of the surface of the single-crystal silicon substrate with nitrogen radicals (there are cases where this includes NH radicals, as well) that are generated by plasma discharge under a gas atmosphere that contains nitrogen. Consequently, bonding strength in bonding of the single-crystal silicon substrate to a support substrate during a subsequent step can be increased.

It is to be noted that the silicon oxynitride film 1102 need not necessarily be provided. Instead of a silicon oxynitride film, a silicon oxide film formed by a thermal oxidation method may be provided. Furthermore, a silicon oxide film may be formed by film formation by a chemical vapor deposition method (a CVD method), in particular, by a plasma chemical vapor deposition method (a plasma CVD method), using a mixed gas of TEOS gas and oxygen gas. It is to be noted that, for the case where a silicon oxide film is formed by film formation by a chemical vapor deposition method (a CVD method) that uses a mixed gas of TEOS gas and oxygen gas, it is preferable that the film be formed at a thickness of greater than or equal to 40 nm and less than or equal to 800 nm.

It is to be noted that, here, "TEOS gas" refers to tetraethyl orthosilicate gas. By provision of a silicon oxide film formed by film formation by a CVD method that uses a mixed gas of TEOS gas and oxygen gas in the bonding interface of the single-crystal silicon substrate and the support substrate, the adhesiveness of the substrates can be increased even more.

It is to be noted that, for the case in which the silicon oxynitride film 1102 is not formed over the surface of the single-crystal silicon substrate, it is preferable that a natural oxide film, a chemical oxide, or an ultra-thin oxide film that is to be formed by irradiation of the surface of the single-crystal silicon substrate with ultraviolet light in an atmosphere that contains oxygen be formed over the surface of the single-crystal silicon substrate. Here, a chemical oxide can be formed by treatment of the surface of the single-crystal silicon substrate with an oxidant such as ozonated water, a solution of hydrogen peroxide, sulfuric acid, or the like. By formation of an oxide film over the surface of the single-crystal silicon substrate, etching of the surface of the single-crystal silicon substrate in the introduction of hydrogen into the single-crystal silicon substrate to be performed later can be prevented.

Figure 1B:
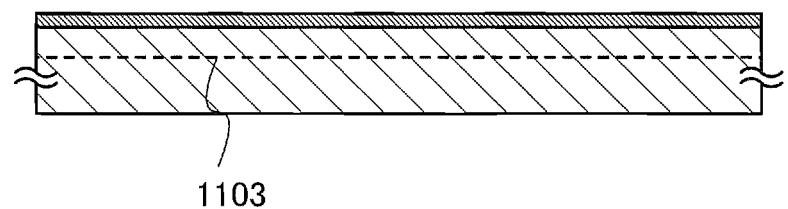
Figure 1C:
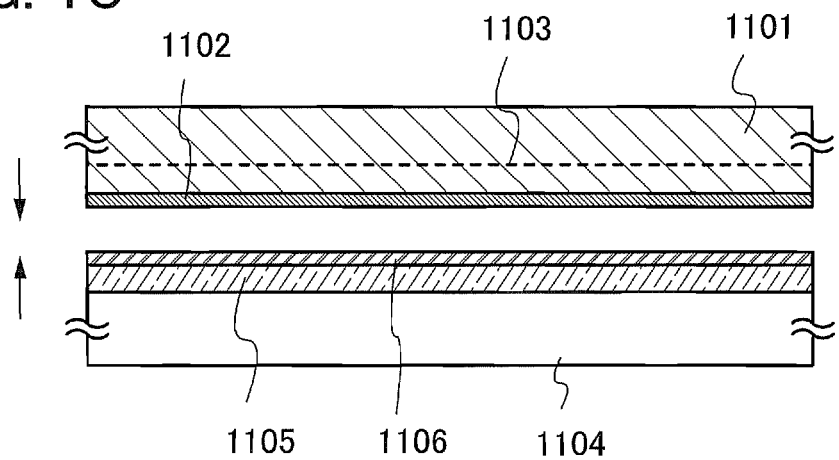

Next, hydrogen is introduced into the single-crystal silicon substrate 1101 through the silicon oxynitride film 1102 to form an embrittled layer 1103 (FIG. 1B). It is to be noted that the depth at which the embrittled layer 1103 is formed (the distance between the interface of the single-crystal silicon substrate and silicon oxynitride film 1102 and the embrittled layer 1103) comes to be the film thickness of a single-crystal silicon film that functions as an active layer in the formation of a TFT to be performed later. For example, hydrogen ions can be added at a dose amount of from $1\times10^{16}$ ions/cm$^2$ to $1\times10^{17}$ ions/cm$^2$ using an ion implantation method so that a single-crystal silicon film with a thickness of 50 nm is left remaining between the surface of the single-crystal silicon substrate 1101 and the embrittled layer 1103. Alternatively, hydrogen ions, with $H_3^+$ ions being the main type of ion species, may be added by use of a non-mass separated ion doping apparatus. By use of $H_3^+$ ions as the hydrogen ions, the length of time required for addition of ions can be shortened.

It is to be noted that the timing of formation of the embrittled layer is not limited to being after the formation of an insulating film. For example, after an ultra-thin oxide film is formed over the single-crystal silicon substrate and hydrogen is introduced into the single-crystal silicon substrate to form the embrittled layer, a silicon oxynitride film, a silicon nitride oxide film, and a silicon oxide film that is formed by film formation by a CVD method that uses a mixed gas of TEOS gas and oxygen gas may be stacked over the single-crystal silicon substrate in the order given. Alternatively, after a silicon oxynitride film and a silicon nitride oxide film are stacked over the single-crystal silicon substrate in the order given and hydrogen is introduced into the single-crystal silicon substrate to form the embrittled layer, a silicon oxide film may be formed by film formation by a CVD method that uses a mixed gas of TEOS gas and oxygen gas. Furthermore, after a silicon oxynitride film, a silicon nitride oxide film, and a silicon oxide film that is formed by film formation by a CVD method that uses a mixed gas of TEOS gas and oxygen gas are stacked over the single-crystal silicon substrate in the order given, hydrogen may be introduced into the single-crystal silicon film to form the embrittled layer. In this way, the timing of the formation of the embrittled layer may occur halfway through or after formation of the insulating film, or the timing may occur after formation of the ultra-thin oxide film and before formation of the insulating film.

It is to be noted that, in the present embodiment mode, treatment used to planarize the surface of the silicon oxynitride film 1102 may be performed. For example, the surface of a silicon oxynitride film can be planarized by polishing treatment that is referred to as chemical-mechanical polishing (CMP). By planarization of the surface of the silicon oxynitride film, the adhesiveness between the substrate and a support substrate that are to be bonded together during a later step can be increased.

Next, the silicon oxynitride film 1102 formed over the single-crystal silicon substrate 1101 is irradiated with an argon ion beam in vacuum, and atoms on the surface of the silicon oxynitride film 1102 are placed in an active state in which chemical bonding easily occurs. Here, the silicon oxynitride film 1102 can be placed in an active state by argon ions, generated by plasma discharge in an argon gas atmosphere, being made to collide with the surface of the silicon oxynitride film 1102. It is to be noted that the surface of the silicon oxynitride film 1102 is not limited to being placed in an active state by exposure to an argon ion beam, and the silicon oxynitride film 1102 can be placed in an active state by the surface of the silicon oxynitride film 1102 being exposed to a plasma atmosphere, X rays, or an electron beam. For a gas used in exposure of the surface of the silicon oxynitride film 1102 to a plasma atmosphere, oxygen; nitrogen; hydrogen; a halogen gas; an inert gas such as argon, helium, or the like; a molecular gas such as ammonia or the like; a compound gas of any compound except for a silane-based compound; a mixed gas of any of these gases; or the like can be used. It is to be noted that it is preferable that the irradiation energy in irradiation of the substrate be controlled by a DC bias within a range of approximately from several volts to 400 volts. Moreover, the surface of the silicon oxynitride film 1102 may be placed in an active state by exposure to an ion atmosphere of ions that have energies of greater than or equal to 20 eV and less than 200 eV.

For example, radio frequency (RF, high frequency) power is applied to generate a plasma using oxygen as a source gas, and the surface of the silicon oxynitride film 1102 can be placed in an active state by performance of plasma treatment on the surface of the silicon oxynitride film 1102 in reactive ion etching (RIE) mode, which uses a capacitively coupled plasma. It is to be noted that, with the present invention, because oxygen is used as the source gas and the surface of a test sample is a film of silicon oxide, silicon oxynitride, or silicon nitride oxide, little etching is performed. The test sample is placed on a cathode electrode or on a stage over a cathode electrode to which a high-frequency voltage is applied via a capacitor. With generation of a plasma by application of a high-frequency voltage, a self-bias of negative polarity is generated by the cathode electrode, positive ions within the plasma are accelerated, and the positive ions reach the surface of the test sample. It is to be noted that, for the plasma treatment, the frequency should be in the range of from 13.56 MHz to 67.8 MHz; the pressure, from 30 Pa to 130 Pa; the power density, from 0.3 W/cm$^2$ to 1.5 W/cm$^2$; and the length of time, from 5 s to 100 s. Specifically, the frequency is 13.56 MHz; the pressure, 67 Pa; the power density, 0.617 W/cm$^2$; and the length of time, 30 s.

Next, the single-crystal silicon substrate 1101 and a support substrate that is provided separately are bonded together. In the present embodiment mode, a glass substrate 1104 is used as the support substrate, and a silicon nitride film that contains oxygen (a silicon nitride oxide film) 1105 and a silicon oxide film that contains nitrogen (a silicon oxynitride film) 1106 are formed over the surface of the glass substrate 1104 in the order given (FIG. 1C). It is to be noted that, as with the silicon oxynitride film 1102 that is formed over the single-crystal silicon substrate 1101, the surface of the silicon oxynitride film 1106 may be activated. It is to be noted that the silicon nitride oxide film 1105 and the silicon oxynitride film 1106 need not necessarily be provided over the surface of the glass substrate 1104. For example, a support substrate where a silicon oxide is formed over the surface of a glass substrate by film formation by a CVD method that uses a mixed gas of TEOS gas and oxygen gas may be used, as well. Furthermore, a glass substrate over a surface of which no insulating film is formed may also be used. In this case, it is preferable that the surface of the glass substrate be cleaned.

Figure 2A:
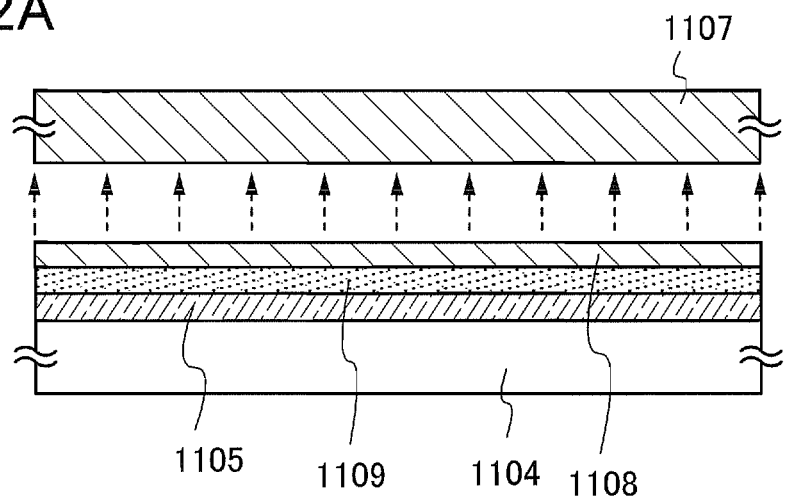
FIGS. 2A and 2B are diagrams used to describe a method of manufacturing an SOI substrate in accordance with an Embodiment Mode of the present invention.

In the present embodiment mode, by the single-crystal silicon substrate 1101, over a surface of which the silicon oxynitride film 1102 is formed, and the glass substrate 1104, over a surface of which the silicon nitride oxide film 1105 and the silicon oxynitride film 1106 are formed, being bonded together, a chemical bond is formed at the interface of the silicon oxynitride film 1102 and the silicon oxynitride film 1106, and a silicon oxynitride film 1109 of the bonded silicon oxynitride film 1102 and silicon oxynitride film 1106 is formed (FIG. 2A).

In the present embodiment mode, by irradiation of the surface of a substrate with an argon ion beam or the like in a vacuum, an adsorbed gas, a natural oxide film, or the like present on the surface of the substrate is etched, the surface of the substrate is activated by application of a bonding force used to bond substrates together at the surfaces of the substrates, and then, the substrates can be bonded together by superposition of the two substrates on top of each other. At the interface of substrates bonded together in this way, interatomic bonds are formed, and a strong bond can be formed without any heat treatment being performed. It is to be noted that performing bonding after activation of the surface of the substrate with no exposure of the substrate to the atmosphere is preferable.

It is to be noted that, instead of a glass substrate, a plastic substrate may also be used, and a flexible substrate such as a film may be used, as well. For a plastic substrate, a substrate made of polyethylene terephthalate (PET), polyethylene naphthalate (PEN), or polyethersulfone (PES) may be used; for the flexible substrate, a synthetic resin such as acrylic or the like may be used. Furthermore, a substrate, such as a quartz substrate, a ceramic substrate, a crystallized glass substrate, or the like, that has a high resistance to heat may be used as well. When these substrates are used, it is desirable that an external force of a water jet, a blade, vibration, or the like be applied for separation of the substrates.

It is to be noted that the silicon nitride oxide film 1105 and the silicon oxynitride film 1106 formed over the surface of the glass substrate 1104 function as blocking layers by which the diffusion of impurities from the glass substrate can be prevented. Because glass substrates contain mobile ions that are readily transferred, provision of a blocking layer is especially effective. It is to be noted that the silicon nitride oxide film 1105 and the silicon oxynitride film 1106 can be formed using a method such as a CVD method such as a plasma CVD method, a low-pressure CVD method, or the like; a sputtering method; or the like.

Here, it is preferable that treatment used to planarize the surface of the silicon oxynitride film 1106 be performed. For example, the surface of a silicon oxynitride film can be planarized by CMP. By planarization of the surface of the silicon oxynitride film, the adhesiveness between the substrate and a support substrate that are to be bonded together during a later step can be increased.

Next, heat treatment (a first heat treatment) is performed at a temperature of from 400° C. to 600° C. Due to this heat treatment, changes in the volume of microcavities of the embrittled layer 1103 occur, and a fracture surface along the embrittled layer 1103 is produced. Herewith, the single-crystal silicon substrate 1101 is split up, and the silicon nitride oxide film 1105, the silicon oxynitride film 1109, and a single-crystal silicon film 1108 are left remaining over the glass substrate 1104 by removal of a single-crystal silicon film 1107 that is separated from the single-crystal silicon substrate 1101 (FIG. 2A).

Next, treatment used to planarize the surface of the single-crystal silicon film 1108 may be performed. The planarization treatment can be performed by CMP. In the present embodiment mode, the final film thickness of the single-crystal silicon film 1108 may be set to be from 10 nm to 200 nm (preferably, from 10 nm to 70 nm, even more preferably, from 20 nm to 50 nm).

Figure 2B:
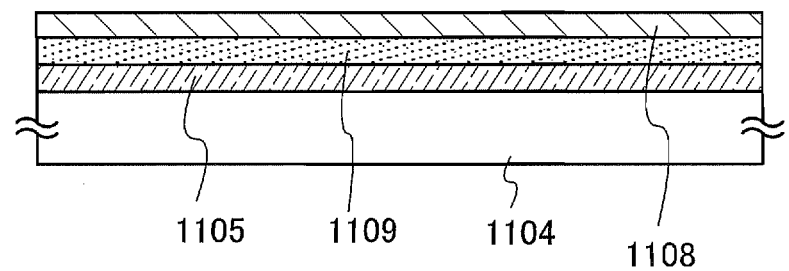

By the above steps, the SOI substrate of the present embodiment mode can be fabricated (FIG. 2B). In the present embodiment mode, because a bonding force used to bond substrates together is applied to the surfaces of the substrates so that the two substrates are superimposed on top of each other, strong bonding can be achieved without any high temperature heat treatment being performed. Consequently, there is no need to use an expensive substrate with a high resistance to heat, and thus, an inexpensive glass substrate, plastic substrate or the like can be used, and a reduction in fabrication costs can be achieved. In addition, a flexible substrate that cannot withstand high-temperature processes can also be used, and the range of application of SOI substrates can be increased. Furthermore, by use of a silicon film that contains oxygen or nitrogen as an insulating film interposed between the support substrate and the single-crystal silicon film, contamination of impurities from the substrate into the single-crystal silicon film can be prevented.

It is to be noted that, in the present embodiment mode, an example is shown in which a silicon oxide film that contains nitrogen and a silicon nitride film that contains oxygen are interposed between a glass substrate and a single-crystal silicon substrate; however, the structure of the present invention is not limited to being what is given here, and the structure of the present invention may be a single-layer structure of one layer of any of a silicon oxide film, a silicon nitride film, a silicon oxynitride film, or a silicon nitride oxide film, or the structure may be a stacked-layer structure of any of these stacked together as appropriate. It is to be noted that, in the present specification, "silicon oxynitride" refers to a substance in which the proportion of oxygen is greater than the proportion of nitrogen. For example, "silicon oxynitride" can also be used to refer to silicon oxide that contains nitrogen. In addition, in the present specification, "silicon nitride oxide" refers to a substance in which the proportion of nitrogen is greater than the proportion of oxygen. For example, "silicon nitride oxide" can also be used to refer to silicon nitrogen that contains oxygen.

For example, a silicon oxynitride film may be formed over the surface of a single-crystal silicon substrate, a silicon nitride oxide film may be formed over the surface of a glass substrate, and the single-crystal silicon substrate and the glass substrate may be bonded together with the silicon oxynitride film and the silicon nitride oxide film interposed therebetween. Alternatively, a silicon nitride oxide film and a silicon oxynitride film may be formed over the surface of a glass substrate in the order given, and a single-crystal silicon substrate and the glass substrate may be bonded together with the silicon oxynitride film and the silicon nitride oxide film interposed therebetween. In addition, a silicon oxynitride film and a silicon nitride oxide film may be formed over the surface of a single-crystal silicon substrate in the order given, and moreover, the single-crystal silicon substrate and a glass substrate may be bonded together with the silicon oxynitride film and the silicon nitride oxide film interposed therebetween. In this case, a silicon oxide film may be formed over the surface of the glass substrate by film formation by a CVD method that uses a mixed gas of TEOS gas and oxygen gas. Furthermore, a silicon oxynitride film may be formed over the surface of a single-crystal silicon substrate, a silicon nitride oxide film and a silicon oxynitride film may be formed over the surface of a glass substrate in the order given, the single-crystal silicon substrate and the glass substrate may be bonded together by the two silicon oxynitride films being bonded together, and a silicon oxide film may be formed between the silicon oxynitride film and the silicon nitride oxide film by film formation by a CVD method that uses a mixed gas of TEOS gas and oxygen gas. Moreover, a silicon oxide film formed by film formation by a CVD method that uses a mixed gas of TEOS gas and oxygen gas and a silicon nitride oxide film may be formed over the surface of a single-crystal silicon substrate in the order given, a silicon oxide film may be formed over the surface of a glass substrate by film formation by a CVD method that uses a mixed gas of TEOS gas and oxygen gas, and the single-crystal silicon substrate and the glass substrate may be bonded together with the silicon nitride oxide film and the silicon oxide films interposed therebetween.

It is to be noted that providing a silicon oxide film that is formed by film formation by a CVD method that uses a mixed gas of TEOS gas and oxygen gas in the interface between a single-crystal silicon substrate and a glass substrate when the two substrates are bonded together is preferable because adhesiveness can be increased thereby. In particular, providing a silicon oxide film that is formed by film formation by a plasma CVD method in the bonding interface is preferable because bonding strength equal to that of a case in which a thermal oxide film treated by plasma activation is used in the bonding interface can be achieved thereby. For example, after an insulating film of silicon nitride oxide or the like is provided over the surface of a single-crystal silicon substrate, a silicon oxide film may be formed by film formation by a CVD method that uses a mixed gas of TEOS gas and oxygen gas, and the silicon oxide film and a glass substrate may be bonded together. Alternatively, after an insulating film of silicon nitride oxide or the like is provided over the surface of a glass substrate, a silicon oxide film may be formed by film formation by a CVD method that uses a mixed gas of TEOS gas and oxygen gas, and the silicon oxide film and a single-crystal silicon substrate may be bonded together. It is to be noted that, instead of a silicon oxide film formed by film formation by a CVD method that uses a mixed gas of TEOS gas and oxygen gas, a silicon oxide film formed by a sputtering method or the like may be used, as well.

It is to be noted that a silicon nitride film has more blocking capability for the prevention of impurity diffusion from glass than a silicon oxide film. On the other hand, the number of interface states generated in the interface of a base insulating film formed in contact with the single-crystal silicon film 1108 is lower for a silicon oxide film than for a silicon nitride film. As a consequence, for the structure of the base insulating film, it is preferable that the base insulating film formed in contact with the substrate side be a silicon nitride film and the base insulating film formed in contact with the semiconductor film 103 be a silicon oxide film. The reason for this is that, when a TFT in which a silicon nitride film is formed in contact with the semiconductor film and an interface state is generated therebetween is fabricated, charge is trapped in the interface between the base insulating film and the semiconductor film, and there are wide fluctuations in threshold voltage due to the effects on electric field by the trapped charge.

Embodiment Mode 2

In the present embodiment mode, an example of a semiconductor device in which the SOI substrate given in Embodiment Mode 1 is used and a manufacturing method thereof will be described.

Figure 3A:
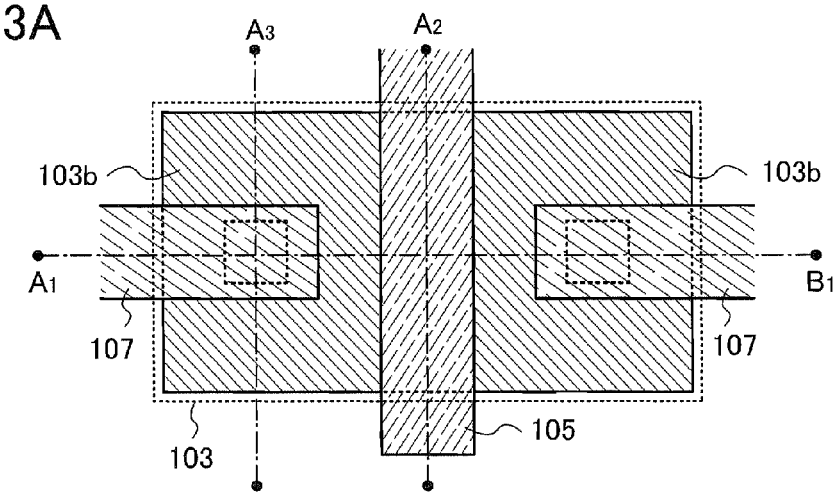
FIGS. 3A to 3D are diagrams illustrating a structure of a thin film transistor in accordance with an Embodiment Mode of the present invention.
Figure 3B:
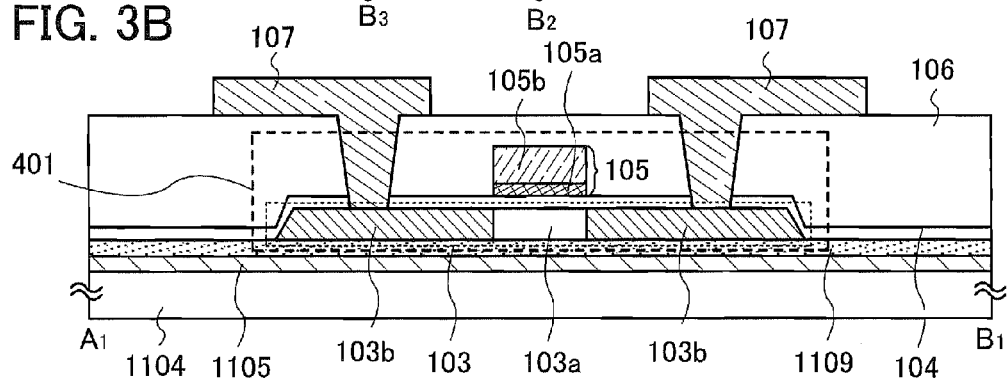
Figure 3C:
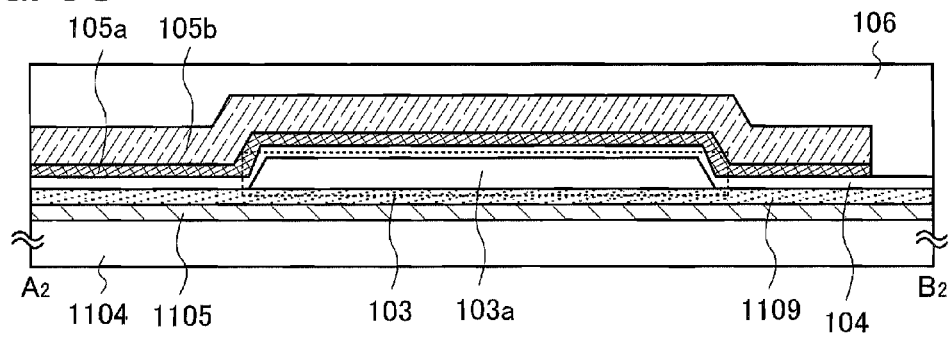
Figure 3D:
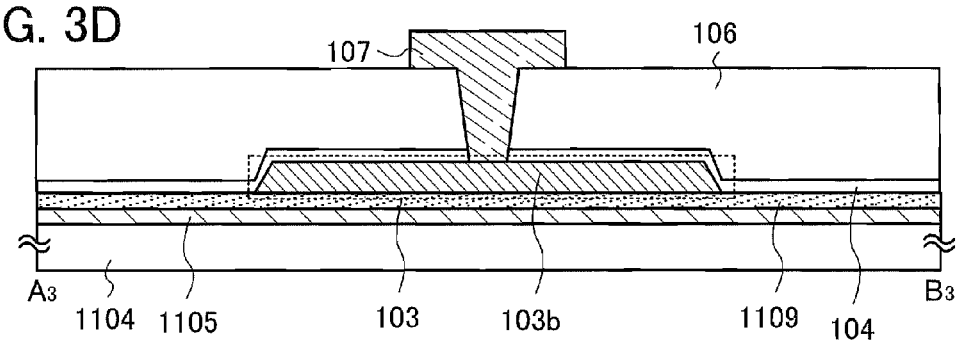

A semiconductor device presented in the present embodiment mode is shown in FIGS. 3A to 3D. It is to be noted that a top-view diagram of the semiconductor device presented in the present embodiment mode is shown in FIG. 3A, a cross-sectional view diagram taken along $A_1$-$B_1$ in FIG. 3A is shown in FIG. 3B, a cross-sectional view diagram taken along $A_2$-$B_2$ in FIG. 3A is shown in FIG. 3C, and a cross-sectional view diagram taken along $A_3$-$B_3$ in FIG. 3A is shown in FIG. 3D.

The semiconductor device presented in the present embodiment mode has the silicon nitride oxide film 1105 that is formed over the surface of the glass substrate 1104; the silicon oxynitride film 1109 that is formed over the silicon nitride oxide film 1105; a thin film transistor (TFT) 401 that includes an island-shaped, single-crystal silicon film 103 that is formed over the silicon oxynitride film 1109, a gate insulating film 104 that is formed over the single-crystal silicon film 103, and a conductive film 105 that functions as a gate electrode formed over the single-crystal silicon film 103 with the gate insulating film 104 interposed therebetween; an insulating film 106 that is provided to cover the gate insulating film 104 and the conductive film 105; and conductive films 107, which each function as a source electrode or a drain electrode, that are formed over the insulating film 106 (FIGS. 3A to 3D).

The conductive film 105 that forms a gate electrode is provided so as to traverse the island-shaped, single-crystal silicon film 103. It is to be noted that, here, a case is shown in which the conductive film 105 is provided as a stacked-layer structure of a first conductive film 105a and a second conductive film 105b; however, the conductive film 105 is not limited to having this kind of structure but may be formed of a single layer or as a stacked-layer structure of three or more layers, as well.

Furthermore, the single-crystal silicon film 103 that is formed into an island shape includes a channel formation region 103a that is provided in a region that overlaps with the conductive film 105 with the gate insulating film 104 interposed therebetween as well as impurity regions 103b, each functioning as a source region or a drain region, that are provided in contact with the channel formation region 103a in regions that do not overlap with the conductive film 105.

Furthermore, the conductive films 107, each forming a source electrode or a drain electrode, are each provided so as to be electrically connected to one of the impurity regions 103b through openings formed in the insulating film 106.

Next, an example of a manufacturing method of the semiconductor device shown in FIGS. 3A to 3D will be described with reference to drawings. It is to be noted that cross-sectional views taken along $A_1$-$B_1$ in FIG. 3A are shown in FIGS. 4A to 4E.

Figure 4A:
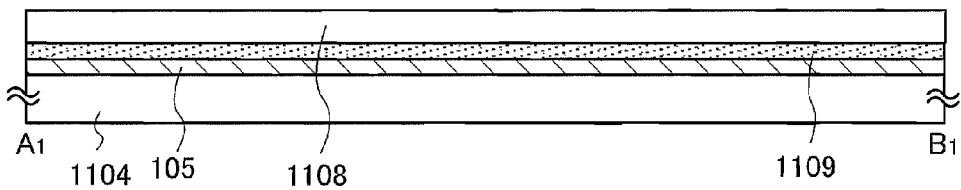
FIGS. 4A to 4E are diagrams used to describe a process of manufacturing a thin film transistor in accordance with an Embodiment Mode of the present invention.

First, as in Embodiment Mode 1, the silicon oxynitride film 1102 is formed over a surface of the single-crystal silicon substrate 1101, and then hydrogen is introduced into the single-crystal silicon substrate 1101 through the silicon oxynitride film 1102 to form the embrittled layer 1103. Next, the silicon oxynitride film 1102 is exposed to a plasma atmosphere or an ion atmosphere, and atoms on the surface of the silicon oxynitride film 1102 are placed in an active state. Then, the single-crystal silicon substrate 1101, over a surface of which is formed the silicon oxynitride film 1102, and the glass substrate 1104, over a surface of which is formed the silicon nitride oxide film 1105 and the silicon oxynitride film 1106, are bonded together, and the silicon oxynitride film 1109 of the bonded silicon oxynitride film 1102 and silicon oxynitride film 1106 is formed. Subsequently, heat treatment is performed at a temperature of from 400° C. to 600° C., the single-crystal silicon substrate 1101 is divided along the embrittled layer 1103, and the single-crystal silicon film 1107 that is separated from the single-crystal silicon substrate 1101 is removed. Consequently, the glass substrate 1104 over which are formed the silicon nitride oxide film 1105, the silicon oxynitride film 1109, and the single-crystal silicon film 1108 is obtained (FIG. 4A).

Figure 4B:
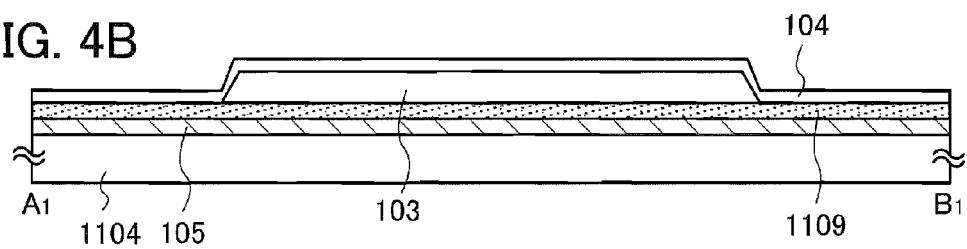

Next, a resist is formed over the single-crystal silicon film 1108 as selected, and the single-crystal silicon film 1108 is etched, whereby the island-shaped, single-crystal silicon film 103 is formed. Then, the gate insulating film 104 covering the single-crystal silicon film 103 is formed (FIG. 4B).

For the gate insulating film 104, silicon oxide, silicon nitride, silicon oxynitride ($SiO_xN_y$, x>y>0), silicon nitride oxide ($SiN_xO_y$, x>y>0), or the like can be applied. This kind of insulating film is formed by a vapor-phase epitaxial method or a sputtering method. Furthermore, with respect to the single-crystal silicon film 103, the gate insulating film 104 can be formed by oxidation or nitridation of the surface of the single-crystal silicon film 103 by performance of high-density plasma treatment in an atmosphere that contains oxygen (for example, an oxygen ($O_2$) and noble gas (including at least one of He, Ne, Ar, Kr, or Xe) atmosphere or an oxygen, hydrogen ($H_2$), and noble gas atmosphere) or an atmosphere that contains nitrogen (for example, a nitrogen ($N_2$) and noble gas (including at least one of He, Ne, Ar, Kr, or Xe) atmosphere; a nitrogen, hydrogen, and noble gas atmosphere; or an $NH_3$ and noble gas atmosphere).

In addition, high density plasma treatment is performed in an atmosphere of the aforementioned gas under conditions of an electron density of $1\times10^{11}$ electrons·cm$^{-3}$ or more and a plasma electron temperature of 1.5 eV or less. More specifically, high density plasma treatment is performed under conditions of an electron density of greater than or equal to $1\times10^{11}$ electrons·cm$^{-3}$ and less than or equal to $1\times10^{13}$ electrons·cm$^{-3}$ and a plasma electron temperature of greater than or equal to 0.5 eV and less than or equal to 1.5 eV. Because plasma electron density is high and electron temperature near objects to be treated (here, the single-crystal silicon film 103) that are formed over the glass substrate 1104 is low, damage to the objects that are to be treated by the plasma can be prevented. Furthermore, because the plasma electron density is of a high density at $1\times10^{11}$ electrons·cm$^{-3}$ or more, an oxide film formed by oxidation of an object to be irradiated by plasma treatment or a nitride film formed by nitridation of an object to be irradiated by plasma treatment is superior compared to a film formed by a CVD method or sputtering method in terms of uniformity in film thickness and the like, and a more precise film can be formed. In addition, because the plasma electron temperature is low at 1.5 eV or less, oxidation or nitridation can be performed at a temperature lower than the temperature at which traditional plasma treatment and heat oxidation methods are performed. For example, even if plasma treatment is performed at a temperature lower than the strain point of a glass substrate by 100 degrees or more, oxidation or nitridation can be performed adequately enough. For frequencies used in formation of the plasma, a high frequency such as a frequency in the microwave range (a frequency of 2.45 GHz) or the like can be used. By formation of the gate insulating film 104 by oxidation or nitridation of the surface of the single-crystal silicon film 103 by high-density plasma treatment, defect level density, which creates traps for electrons and holes, can be reduced. In addition, disconnect or the like of the gate insulating film even at the edges of the single-crystal silicon film 103 can be reduced, as well.

It is to be noted that an impurity element may be introduced into the single-crystal silicon film 103 at a low concentration in advance to control threshold voltage and the like of the single-crystal silicon film 103. In this case, in the single-crystal silicon film 103, the impurity element comes to be introduced into a region that is to later be a channel formation region, as well. For the impurity element, an impurity element that imparts n-type conductivity or an impurity element that imparts p-type conductivity can be used. For an impurity element that imparts n-type conductivity, phosphorus (P), arsenic (As), or the like can be used. For an impurity element that imparts p-type conductivity, boron (B), aluminum (Al), gallium (Ga), or the like can be used. Here, for the impurity element, boron (B) is introduced over the entire surface of the single-crystal silicon film 103 so that boron (B) is contained in the single-crystal silicon film 103 at a concentration of from $5\times10^{15}$ atoms/cm$^3$ to $5\times10^{17}$ atoms/cm$^3$.

Figure 4C:
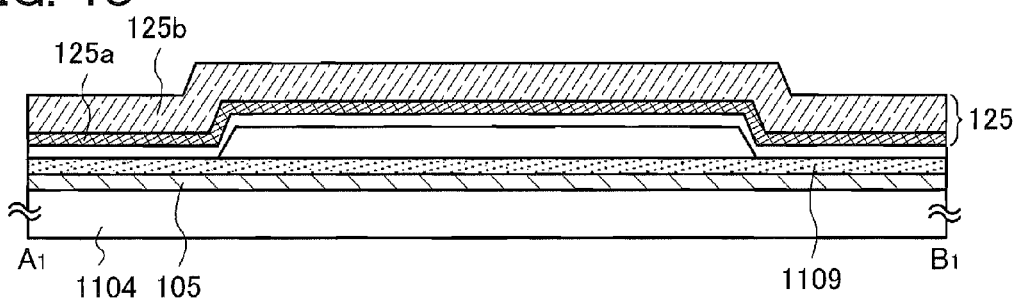

Next, a conductive film 125 is formed over the gate insulating film 104. Here, an example is shown in which a first conductive film 125a and a second conductive film 125b are stacked together for the conductive film 125 (FIG. 4C). Of course, the conductive film 125 may also be Rained as a single layer or as a stacked-layer structure of three or more layers.

The conductive film 125 can be formed of an element selected from tantalum (Ta), tungsten (W), titanium (Ti), molybdenum (Mo), aluminum (Al), copper (Cu), chromium (Cr), niobium (Nb), or the like or formed of an alloy material or compound material that contains one or more of these elements as the main component. Furthermore, the conductive film 125 can also be formed of a semiconductor material typified by polycrystalline silicon that is doped with an impurity element such as phosphorus or the like. For example, the conductive film 125 can be formed as a stacked-layer structure of the first conductive film 125a, which is formed of tantalum nitride, and the second conductive film 125b, which is formed of tungsten. It is to be noted that, in the case where the conductive film 125 is formed by stacked layers, the materials given above can be combined together freely.

Figure 4D:
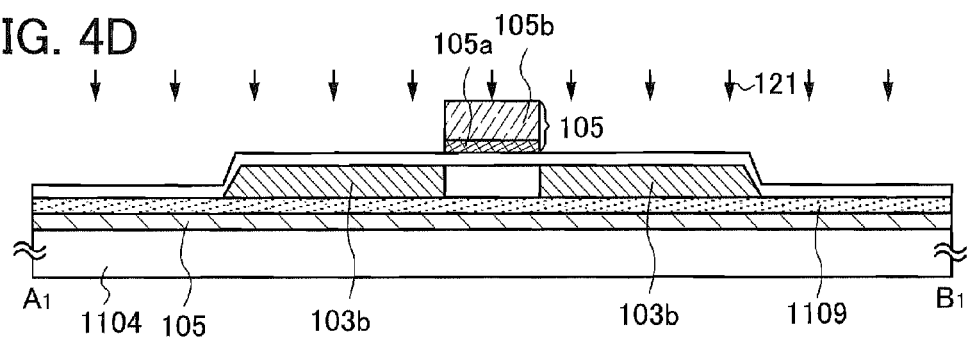

Next, by selective etching of the conductive film 125 (here, the stacked-layer structure of the first conductive film 125a and the second conductive film 125b), the conductive film 105 (here, the stacked-layer structure of the conductive film 105a and the conductive film 105b) that functions as a gate electrode is formed, and then, by introduction of an impurity element 121 into the single-crystal silicon film 103 using the conductive film 105 as a mask, the impurity regions 103b in the single-crystal silicon film 103 are formed (FIG. 4D). Here, because an impurity element is introduced after the conductive film 105 that traverses the island-shaped, single-crystal silicon film 103 is formed, the impurity regions 103b are formed in regions in which the single-crystal silicon film 103 do not overlap with the conductive film 105.

For the impurity element 121, an impurity element that imparts n-type conductivity or an impurity element that imparts p-type conductivity can be used. For an impurity element that imparts n-type conductivity, phosphorus (P), arsenic (As), or the like can be used. For an impurity element that imparts p-type conductivity, boron (B), aluminum (Al), gallium (Ga), or the like can be used. In the present embodiment mode, for the impurity element 121, boron (B) is introduced into the single-crystal silicon film 103 so that boron (B) is contained in the single-crystal silicon film 103 at a concentration of from $1\times10^{19}$ atoms/cm$^3$ to $1\times10^{20}$ atoms/cm$^3$, and the impurity regions 103b that exhibit p-type conductivity are formed.

Figure 4E:
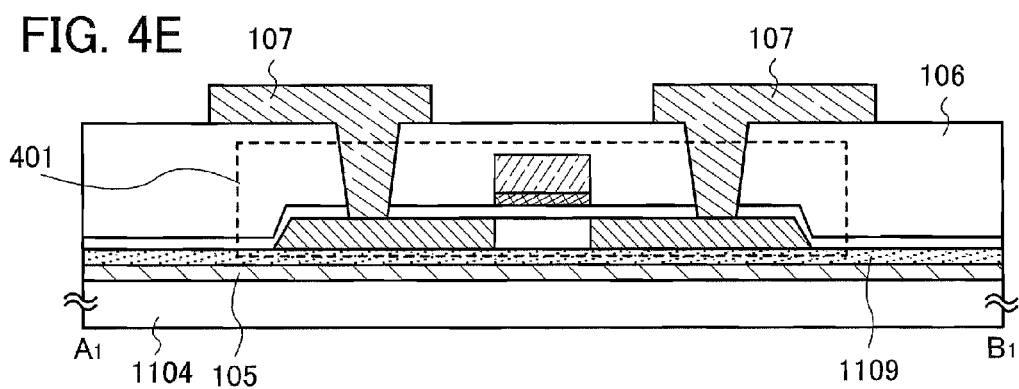

Next, the insulating film 106 is formed so as to cover the conductive film 105, the gate insulating film 104, and the like. The conductive films 107, each of which functions as a source electrode or a drain electrode, are formed as selected over the insulating film 106 (FIG. 4E). Each of the conductive films 107 is provided so as to be electrically connected to one of the impurity regions 103b, each of which forms a source region or drain region of the single-crystal silicon film 103.

For the insulating film 106, silicon oxide, silicon oxynitride ($SiO_xN_y$, where x>y>0), silicon nitride oxide ($SiN_xO_y$, where x>y>0), or the like formed by a CVD method, a sputtering method, or the like can be used. Alternatively, the insulating film 106 can be formed of a single layer or a stacked-layer structure formed of an organic material such as polyimide, polyamide, polyvinyl phenol, benzocyclobutene, acrylic, epoxy, or the like; a siloxane material of a siloxane resin or the like; an oxazole resin; or the like. It is to be noted that a siloxane material corresponds to a material that contains Si—O—Si bonds. The skeleton structure of siloxane is formed of bonds of silicon (Si) and oxygen (O). As a substituent, an organic group (for example, an alkyl group or an aryl group) that contains at least hydrogen is used. As a substituent, a fluoro group may be used, as well. As substituents, an organic group that contains at least hydrogen and a fluoro group may be used, as well. An oxazole resin is, for example, photosensitive polybenzoxazole or the like. Photosensitive polybenzoxazole is a material with a low dielectric constant (a dielectric constant equal to 2.9 at 1 MHz and room temperature), a high resistance to heat (by differential thermal analysis (DTA), it is found to have a thermal decomposition temperature of 550° C. at a rate of temperature increase of 5° C./min), and a low percentage of water absorption (0.3% over 24 hours at room temperature). Because the relative dielectric constant for an oxazole resin (a relative dielectric constant of approximately 2.9) is low compared to the relative dielectric constant for polyimide or the like (a relative dielectric constant of approximately 3.2 to 3.4), parasitic capacitance can be suppressed and operations can be performed at high speed. Here, the insulating film 106 is formed of a single layer or of stacked layers of silicon oxide, silicon oxynitride ($SiO_xN_y$, where x>y>0), silicon nitride oxide ($SiN_xO_y$, where x>y>0), or the like formed by a CVD method. Alternatively, the insulating film 106 may also be formed of stacked layers of an organic material such as polyimide, polyamide, polyvinyl phenol, benzocyclobutene, acrylic, epoxy, or the like; a siloxane material of a siloxane resin or the like; an oxazole resin; or the like.

For the conductive films 107, a single-layer structure or stacked-layer structure formed of one element selected from aluminum, tungsten, titanium, tantalum, molybdenum, nickel, or neodymium or formed of an alloy that contains a plurality of the elements given here can be used. For example, for a conductive film that is formed of an alloy that contains a plurality of the elements given above, a conductive film formed of an aluminum alloy that contains titanium, an aluminum alloy that contains neodymium, or the like can be used. Furthermore, for the case where the conductive films 107 are each provided as a stacked-layer structure, for example, a structure in which an aluminum layer or an aluminum alloy layer, such one of those described above, is interposed between titanium layers may be used, as well.

By the steps described above, a semiconductor device that includes the TFT 401 can be fabricated. In the present embodiment mode, an SOI substrate in which strong bonding is achieved without any performance of high temperature heat treatment is used. Consequently, fabrication costs for the SOI substrate can be curtailed, and a reduction in costs of a semiconductor device that is fabricated using this SOI substrate can be achieved. Moreover, because a single-crystal silicon film can be used as an active layer of a TFT, a TFT with good characteristics can be fabricated over a glass substrate or a plastic substrate. A flexible substrate that cannot withstand high-temperature processes can also be used, and the range of applications of the semiconductor device can be increased. In addition, because a silicon film that contains oxygen or nitrogen is used as an insulating film interposed between a substrate and a single-crystal silicon film, the level of adverse effect on the characteristics of the semiconductor device due to contamination of impurities from the substrate into the single-crystal silicon film can be reduced.

Embodiment Mode 3

In the present embodiment mode, a method for manufacturing an EL display device in which the semiconductor device fabricated in Embodiment Mode 2 is used will be described with reference to drawings.

In the present embodiment mode, a first electrode 512 is formed using a film that transmits light so that light is extracted from an electroluminescent element from the first electrode 512 side. In the present embodiment mode, indium tin oxide that contains silicon oxide (ITSO) is used for the first electrode 512.

Figure 5:
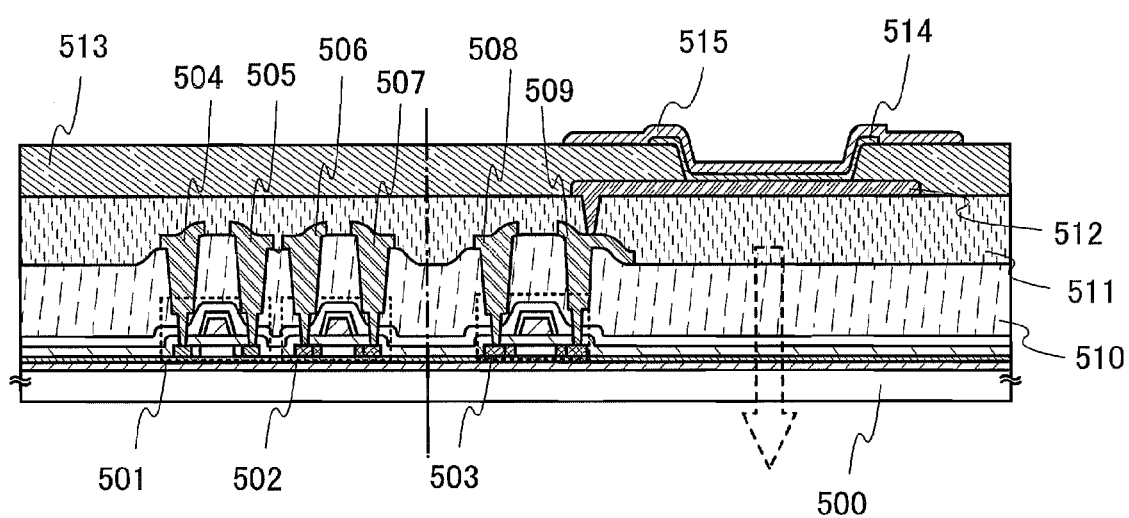
FIG. 5 is a diagram illustrating a structure of a display device in accordance with an Embodiment Mode of the present invention.

First, an SOI substrate is formed as described in Embodiment Mode 2, and TFTs 501 to 503; a first insulating film 510 that covers that TFTs 501 to 503; wirings 504 to 509, each of which is connected to a source or drain of one of the TFTs 501 to 503 are formed over the SOI substrate. Next, a second insulating film 511 is formed so as to cover the TFTs 501 to 503, the first insulating film 510, and the wirings 504 to 509, and the first electrode 512 that is electrically connected to the wiring 509 is formed over the second insulating film 511. Then, a third insulating film 513 (also referred to as a bank, a partition wall, a barrier, a mound, and the like) is formed so as to cover the edge of the first electrode 512 and the second insulating film 511 (FIG. 5).

For the third insulating film 513, an inorganic insulating material of silicon oxide, silicon nitride, silicon oxynitride, aluminum oxide, aluminum nitride, aluminum oxynitride, or the like; acrylic acid, methacrylic acid, or a derivative thereof; a heat-resistant macromolecular material such as polyimide, aromatic polyamide, polybenzimidazole, or the like; inorganic siloxane that contains Si—O—Si bonds, out of compounds that are composed of silicon, oxygen, and hydrogen; or an organic siloxane-based insulating material in which hydrogen that is bonded to silicon is substituted for by an organic group such as methyl or phenyl can be used. The third insulating film 513 may also be formed by use of a photosensitive material or non-photosensitive material of acrylic, polyimide, or the like. In the present embodiment mode, the third insulating film 513 is formed using photosensitive polyimide so as to have a film thickness of 1.5 μm in a flat region.

Furthermore, it is preferable that the shape of the third insulating film 513 be a shape the radius of curvature of which continuously changes, and the degree of coverage by an electroluminescent layer 514 (a layer that contains an organic compound) and a second electrode 515 that are formed over the third insulating layer 513 can be improved.

Moreover, in order to further improve reliability, oxidation or nitridation by use of a high-density plasma apparatus may be performed on the first electrode 512 and the third insulating layer 513 before the electroluminescent layer 514 is formed. By oxidation or nitridation of the first electrode 512 by use of a high-density plasma apparatus, because little plasma damage occurs in modification of the surface of an electrode and a surface with even fewer defects can be obtained, display with high definition and less unevenness in the display can be produced by light-emitting elements of the present embodiment mode. Furthermore, in the case in which the third insulating film 513 is nitrided, the surface of the insulating film 513 is modified, and moisture can be prevented from being absorbed into the insulating film. In addition, in the case in which the third insulating film 513 is oxidized, the film becomes strengthened, and discharge of organic gases can be suppressed. In the present embodiment mode, by use of a high-density plasma apparatus, treatment with less plasma damage can be performed. Here, with respect to the third insulating film 513, whether oxidation is to be performed or nitridation is to be performed may be selected as appropriate in consideration of the materials and effects of the insulating film.

Next, the electroluminescent layer 514 is formed over the first electrode 512. It is to be noted that, although only one pixel is shown in FIG. 5, in the present embodiment mode, electroluminescent electrodes corresponding to each color of red (R), green (G), and blue (B) are formed. For the electroluminescent layer 514 of the present embodiment mode, materials exhibiting light emission of red (R), green (G), and blue (B) are each formed as selected by an evaporation method using an evaporation mask. The materials exhibiting light emission of red (R), green (G), and blue (B) may each be formed by a method used for selective formation by an evaporation method using an evaporation mask or formed by a liquid droplet discharge method. With the case in which a liquid droplet discharge method is used, there is an advantage in that division of colors of RGB can be performed without use of a mask. In the present embodiment mode, materials exhibiting light emission of red (R), green (G), and blue (B) are each formed by an evaporation method.

It is to be noted that, before deposition of the EL, performing heat treatment in an atmosphere that contains an inert gas as its main component where the concentration of oxygen is 5% or less and the concentration of water is 1% or less to remove moisture and the like is preferable. In the present embodiment mode, heat treatment is performed at a temperature of 300° C. for one hour.

Next, the second electrode 515 that is made from a conductive film is formed over the electroluminescent layer 514. For the second electrode 515, a material that has a low work function (a material such as Al, Ag, Li, or Ca or an alloy of any of these such as MgAg, MgIn, AlLi, $CaF_2$, or the like) may be used. In this way, a light-emitting element made up of the first electrode 512, the electroluminescent layer 514, and the second electrode 515 is formed.

In the semiconductor device shown in FIG. 5, light emitted from the light-emitting element is transmitted through the films that are fowled between a substrate 500 and the first electrode 512 and emitted from the first electrode 512 side in the direction indicated by the arrow.

Moreover, provision of a passivation film so that the passivation film covers the second electrode 515 is effective. The passivation film can be formed using an insulating film that contains silicon nitride, silicon oxide, silicon nitride oxide, silicon oxynitride, aluminum nitride, aluminum oxynitride, aluminum nitride oxide that contains more nitrogen than oxygen, aluminum oxide, diamond-like carbon (DLC), or a carbon film that contains nitrogen (CN), and a single layer or a stacked layer of the insulating films can be used. In addition, siloxane, the skeleton structure of which is formed of bonds of silicon (Si) and oxygen (O), may be used, as well. As a substituent, an organic group (for example, an alkyl group or an aryl group) that contains at least hydrogen is used. As a substituent or substituents, either a fluoro group or an organic group that contains at least hydrogen and a fluoro group may be used, as well.

In this case, it is preferable that a film with good coverage be used for the passivation film, and use of a carbon film, in particular, a DLC film, is effective. Because a DLC film can be formed by film formation at a temperature that falls within a temperature range of from room temperature to 100° C. or less, the DLC film can easily be formed over the electroluminescent layer 514 that has low resistance to heat. Furthermore, the amount of blocking effect for a DLC film with respect to oxygen is high, and thus, a DLC film can be used to prevent oxidation of the electroluminescent layer 514. For this reason, a problem where the electroluminescent layer 514 is oxidized during a sealing step that is to be performed subsequently can be prevented from occurring.

Next, the substrate 500 over which the light-emitting element is foamed and a sealing substrate are adhered to each other by a sealant to seal in the light-emitting element. Because the infiltration of moisture from a cross section is shielded by the sealant, deterioration of the light-emitting element can be prevented and reliability of the display device can be increased. It is to be noted that a region enclosed by the sealant may be filled in with a filler material and may be filled with nitrogen or the like by sealing being performed in a nitrogen atmosphere. Alternatively, the filler material can be instilled in a liquid state so as to fill in the inside of the display device. In the present embodiment mode, because the EL display device is a bottom-emission type of display device, there is no need to use a filler material that transmits light; however, for a case in which light is extracted after being transmitted through a filler material, there is a need to use a material that transmits light as the filler material. For an example of a filler material, a visible light curable, ultraviolet light curable, or heat curable epoxy resin or the like can be given. By the steps given above, a display device that has light-emitting elements is completed.

In addition, it is preferable that a desiccant material be placed inside the EL display panel to prevent deterioration of the element due to moisture. In the present embodiment mode, a desiccant material is placed in a depression that is formed in the sealing substrate so as to encircle a pixel region, and the structure is set to be one in which thinning of a device is not impeded. Furthermore, the area of absorption can be increased by placement of a desiccant material in a region that corresponds to a gate wiring layer, as well, and the absorption effect is high. Moreover, because the desiccant material is formed over a gate wiring layer that does not directly emit light, the efficiency of the light extraction is not decreased.

It is to be noted that treatment for sealing of the light-emitting element is treatment performed for protection of the light-emitting element from moisture, and any one of a method for mechanical sealing of the light-emitting element by use of a cover material, a method for sealing of the light-emitting element by use of a heat curable resin or an ultraviolet light curable resin, or a method for sealing of the light-emitting element by use of a thin film that has high barrier capability against metal oxides, nitrides, and the like is used. For a sealing substrate or cover material, glass, ceramic, plastic, or metal can be used; however, the cover material that can transmit light needs to be used for the case where light is extracted from the cover material side. In addition, the cover material and the substrate over which the light-emitting element is formed are attached to each other using a sealant such as a heat curable resin or an ultraviolet light curable resin, and the resin is hardened by heat treatment or irradiation with ultraviolet light to form a sealed space. Providing a moisture-absorbing material typified by barium oxide in this sealed space is also effective. This moisture-absorbing material may be provided on the sealing material or provided over the partition wall or in the periphery of the light-emitting element so that light from the light-emitting element is not blocked. Further, the space between the cover material and the substrate over which the light-emitting element is formed can also be filled in with a heat curable resin or an ultraviolet light curable resin. In this case, adding a moisture-absorbing material typified by barium oxide to the thermal curable resin or the ultraviolet ray curable resin is effective.

The thin film transistors 501 to 503 shown in the present embodiment mode are fabricated using the method presented in Embodiment Mode 2, and a single-crystal silicon film formed by the method presented in Embodiment Mode 1 is used for an active layer of each of the thin film transistors 501 to 503. For this reason, fabrication costs for the SOI substrate can be curtailed, and a reduction in costs of a semiconductor device that is fabricated using this SOI substrate can be achieved. Moreover, because a single-crystal silicon film can be used as an active layer of a TFT, a TFT with good characteristics can be fabricated over a glass substrate or a plastic substrate. A flexible substrate that cannot withstand high-temperature processes can also be used. In addition, because a silicon film that contains oxygen or nitrogen is used as an insulating film interposed between a substrate and a single-crystal silicon film, the level of adverse effect on the characteristics of the semiconductor device due to contamination of impurities from the substrate into the single-crystal silicon film can be reduced. Consequently, an EL display device with favorable characteristics and in which deterioration of characteristics can be suppressed can be fabricated easily.

Embodiment Mode 4

In the present embodiment mode, a method for manufacturing a transmissive liquid crystal display device in which the semiconductor device fabricated in Embodiment Mode 2 is used will be described with reference to drawings.

Figure 6:
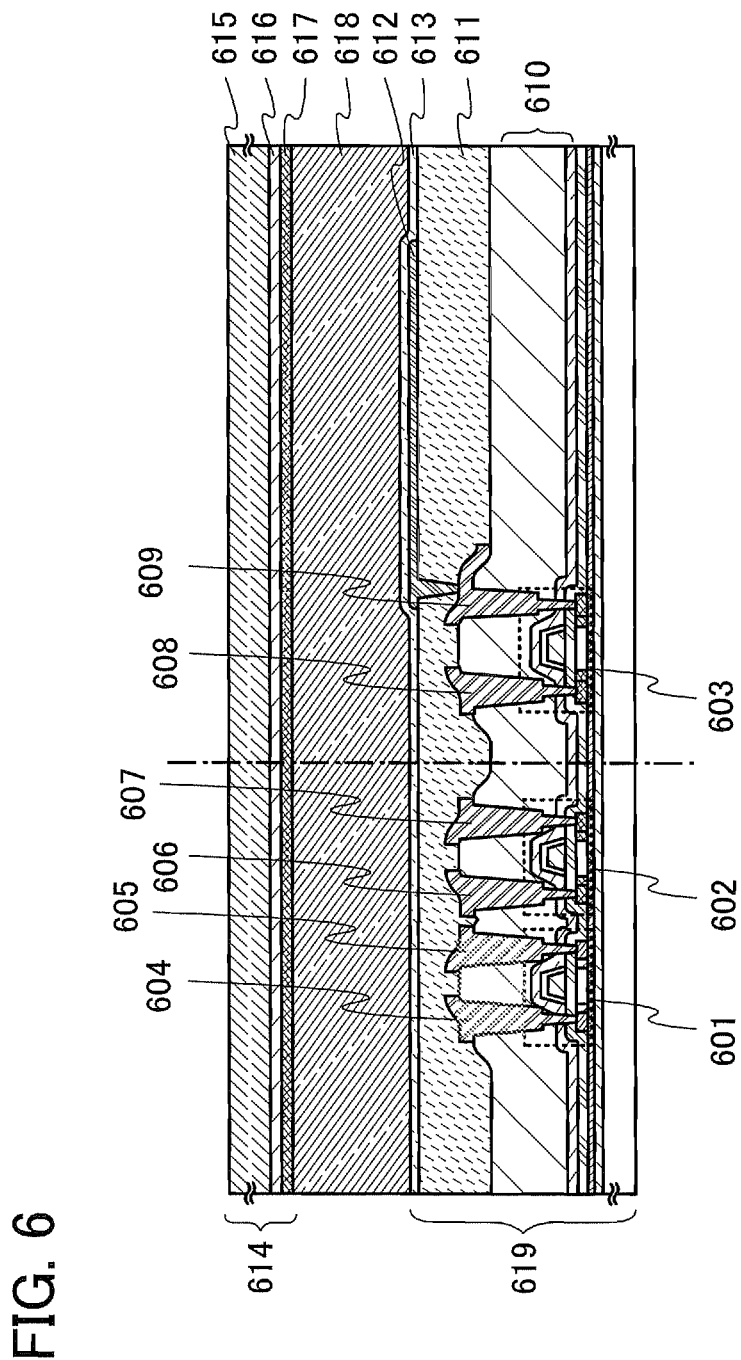
FIG. 6 is a diagram illustrating a structure of a display device in accordance with an Embodiment Mode of the present invention.

First, an SOI substrate is formed as described in Embodiment Mode 2, and TFTs 601 to 603; a first insulating film 610 that covers that TFTs 601 to 603; and wirings 604 to 609, each of which is connected to a source or drain of one of the TFTs 601 to 603 are formed over the SOI substrate. Next, a second insulating film 611 is formed so as to cover the TFTs 601 to 603, the first insulating film 610, and the wirings 604 to 609, and a first electrode 612 that is electrically connected to the wiring 609 is formed over the second insulating film 611. In the present embodiment mode, for a material used for the first electrode 612, indium tin oxide that contains silicon oxide (ITSO) is used. Next, an alignment film 613 is formed over the second insulating film 611 and the first electrode 612. In the present embodiment mode, polyimide is used for the alignment film 613. Next, a counter substrate 614 is prepared. The counter substrate 614 is formed of a glass substrate 615, a counter electrode 616 that is fouled of a transparent conductive film, and an alignment film 617 (FIG. 6).

Next, a TFT substrate 619 and the counter substrate 614 obtained by the steps described above are attached to each other with a sealant. Here, a spacer may be provided between the alignment film 613 and the alignment film 617 in order that the width of a gap between the two substrates be kept constant. Subsequently, a liquid crystal 618 is injected into the gap between the two substrates, and a transmissive liquid crystal display device like the one shown in FIG. 6 is completed by being sealed up with the sealant.

It is to be noted that a transmissive liquid crystal display is described in the present embodiment mode; however, the liquid crystal display of the present invention is not limited to being this type of display. By use of an electrode that is reflective for the first electrode 612 or by provision of a reflective film on an upper surface or lower surface of the first electrode 612, the present invention can be used in a reflective liquid crystal display, as well. Furthermore, the present invention may be used in a semi-transmissive liquid crystal display device, as well.

The thin film transistors 601 to 603 shown in the present embodiment mode are fabricated using the method presented in Embodiment Mode 2, and a single-crystal silicon film formed by the method presented in Embodiment Mode 1 is used for an active layer of each of the thin film transistors 601 to 603. For this reason, fabrication costs for the SOI substrate can be curtailed, and a reduction in costs of a semiconductor device that is fabricated using this SOI substrate can be achieved. Moreover, because a single-crystal silicon film can be used as an active layer of a TFT, a TFT with good characteristics can be fabricated over a glass substrate or a plastic substrate. A flexible substrate that cannot withstand high-temperature processes can also be used. In addition, because a silicon film that contains oxygen or nitrogen is used as an insulating film interposed between a substrate and a single-crystal silicon film, the level of adverse effect on the characteristics of the semiconductor device due to contamination of impurities from the substrate into the single-crystal silicon film can be reduced. Consequently, an EL display device with favorable characteristics and in which deterioration of characteristics can be suppressed can be fabricated easily.

Embodiment Mode 5

In the present embodiment mode, a fabrication method of a semiconductor device, which can communicate by wireless transmission, that includes a thin film transistor, a memory element, and an antenna will be described with reference to drawings.

The semiconductor device presented in the present embodiment mode is shown in FIGS. 7A and 7B. It is to be noted that an example of a top-view structure of the semiconductor device presented in the present embodiment mode is shown in FIG. 7A and part of a cross-sectional structure of the semiconductor device of FIG. 7A is shown in FIG. 7B.

In the present embodiment mode, a semiconductor device 700 has an integrated circuit section 701, a memory section 702, and an antenna 703 (FIG. 7A). It is to be noted that, in FIG. 7B, a region 704 corresponds to part of the cross-sectional structure of the integrated circuit section 701 of FIG. 7A, a region 705 corresponds to part of the cross-sectional structure of the memory section 702 of FIG. 7A, and a region 706 corresponds to part of the cross-sectional structure of the antenna 703 of FIG. 7A.

The semiconductor device of the present embodiment mode has thin film transistors (TFTs) 712 to 716 that are formed over a first substrate 710 with a first insulating film 711 interposed therebetween; a second insulating film 717 that is formed over the thin film transistors 712 to 716; and conductive films 718 to 727, each of which functions as a source electrode or a drain electrode, that are provided over the second insulating film 717, as shown in FIG. 7B. In addition, the semiconductor device of the present embodiment mode has a third insulating film 728 that is provided over the second insulating film 717 and the conductive films 718 to 727, each of which functions as a source electrode or a drain electrode; conductive films 729 to 731 that are provided over the third insulating film 728; a fourth insulating film 732 that is provided so as to cover the third insulating film 728 and a part of each of the conductive films 729 to 731; memory element sections 733 and 734 that are provided over the fourth insulating film 732; a conductive film 735, which functions as an antenna, that is provided over the conductive film 731; a fifth insulating film 736 that is provided so as to cover the fourth insulating film 732, the memory element sections 733 and 734, and the conductive film 735 that functions as an antenna; and a second substrate 737 that is provided over the fifth insulating film 736. It is to be noted that the integrated circuit portion 701, the memory section 702, and the antenna 703 of the semiconductor device are sealed in by the first substrate 710 and the second substrate 737.

The thin film transistors 712 to 716 shown in the present embodiment mode are fabricated using the method presented in Embodiment Mode 2, and a single-crystal silicon film formed by the method presented in Embodiment Mode 1 is used for an active layer of each of the thin film transistors 712 to 716. For this reason, fabrication costs for the SOI substrate can be curtailed, and a reduction in costs of a semiconductor device that is fabricated using this SOI substrate can be achieved. Moreover, because a single-crystal silicon film can be used as an active layer of a TFT, a TFT with good characteristics can be fabricated over a glass substrate or a plastic substrate. A flexible substrate that cannot withstand high-temperature processes can also be used. In addition, because a silicon film that contains oxygen or nitrogen is used as an insulating film interposed between a substrate and a single-crystal silicon film, the level of adverse effect on the characteristics of the semiconductor device due to contamination of impurities from the substrate into the single-crystal silicon film can be reduced. Consequently, a semiconductor device, which can communicate by wireless transmission, with favorable characteristics and in which deterioration of characteristics can be suppressed can be fabricated easily.

Embodiment 1

In the present embodiment, a hydrogen introduction method in formation of an embrittled layer will be considered.

In the aforementioned embodiment modes, in formation of an embrittled layer, a single-crystal silicon substrate is irradiated with ions derived from hydrogen (H) (hereinafter, these ions will be referred to as hydrogen ion species). More specifically, hydrogen gas or a gas that contains hydrogen in its composition is used as a source gas, a hydrogen plasma is generated, and a single-crystal silicon substrate is irradiated with the hydrogen ion species in the hydrogen plasma.

(Ions in Hydrogen Plasma)

In a hydrogen plasma such as that described above, hydrogen ion species of $H^+$, $H_2^+$, and $H_3^+$ are present. Here, reaction processes (formation processes, decomposition processes) of each hydrogen ion species are presented in the reaction formulas given below.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 8:
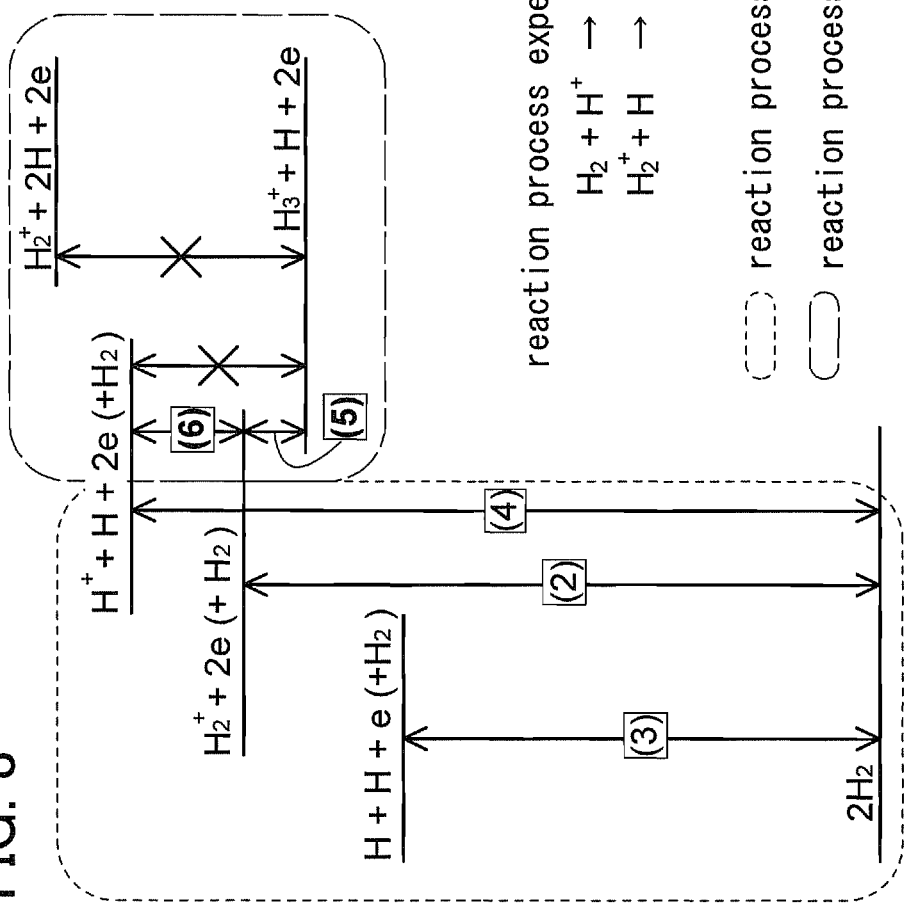
FIG. 8 is a diagram illustrating an energy diagram of different hydrogen ion species.

In FIG. 8, an energy diagram in which some of the reactions given above are represented schematically is shown. It is to be noted that the energy diagram shown in FIG. 8 is merely a schematic representation and does not depict the relationships of energies of the reactions exactly.

(Formation Processes of $H_3^+$ Ions)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the amount of potential energy lost by transfer of the charged particle. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 9:
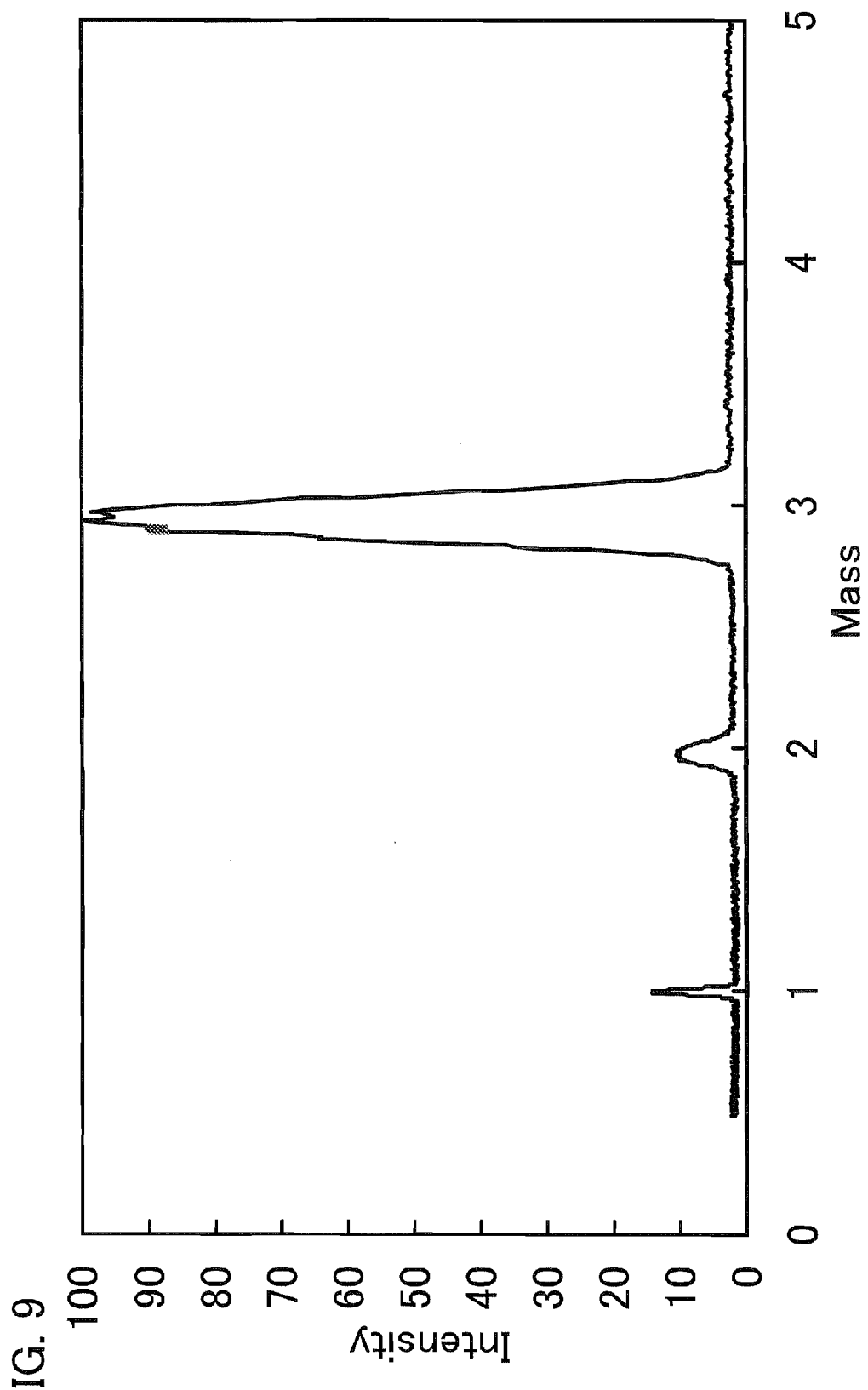
FIG. 9 is a graph showing results of ion mass spectrometry analysis.

Here, an example, in which the proportions of ion species (particularly, the proportion of $H_3^+$) are different, is described. FIG. 9 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 9, the number of ions with different masses is expressed as a relative proportion where the number of ions with a mass of 3 is defined as 100. It can be seen from FIG. 9 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 10:
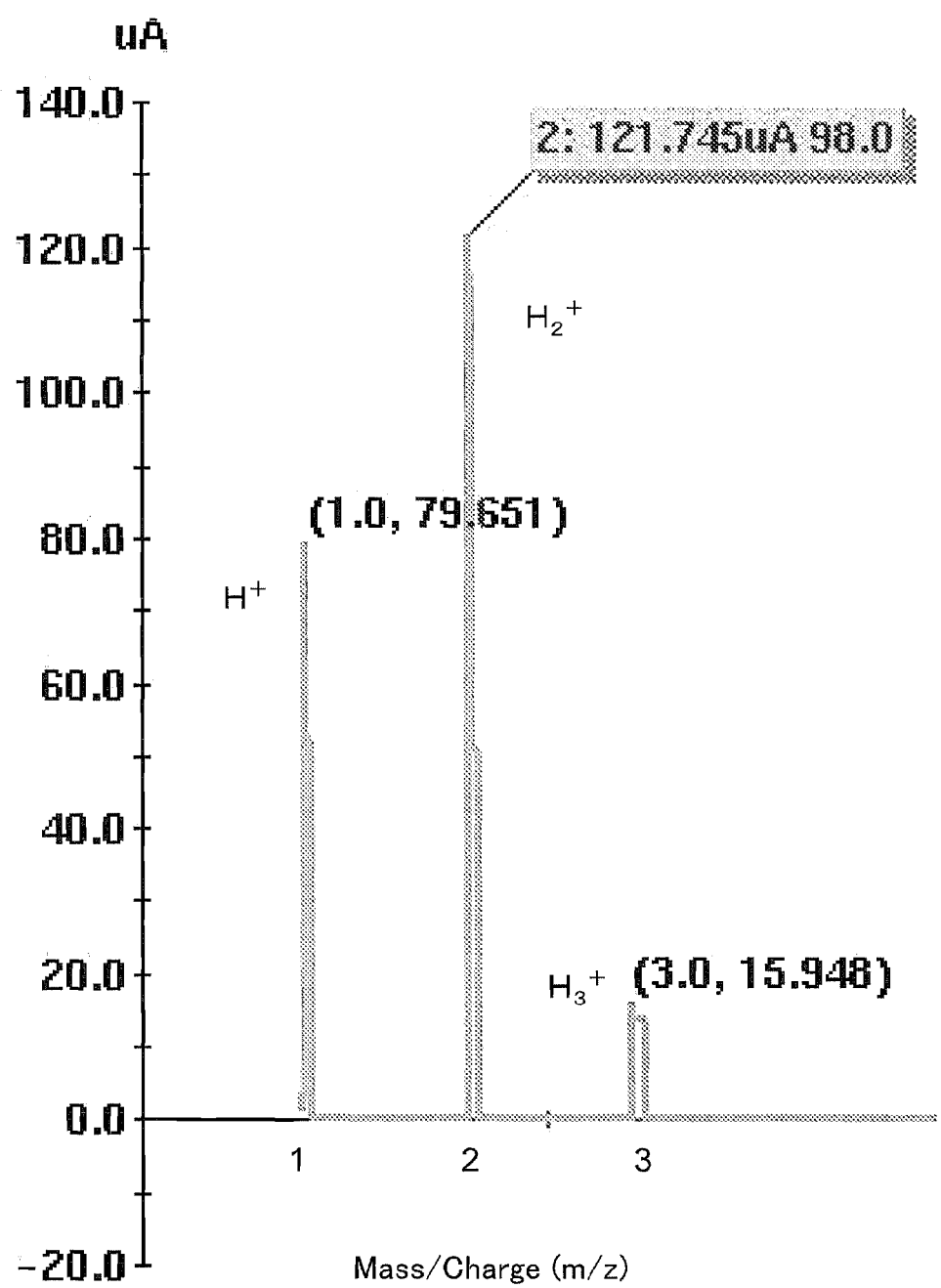
FIG. 10 is a graph showing results of ion mass spectrometry analysis.

FIG. 10 is a graph showing the results of mass spectrometry of ions that are generated from $PH_3$ when an ion source different from that for the case of FIG. 9 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 9, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 10 that the ratio between ion species in a plasma, i.e., the ratio between $H^+$, $H_2^+$, and $H_3^+$, is about 37:56:7. Note that, although FIG. 10 shows the data obtained when the source gas is $PH_3$, the ratio between the hydrogen ion species is about the same when a 100% hydrogen gas is used as a source gas, as well.

In the case of the ion source from which the data shown in FIG. 10 is obtained, $H_3^+$, of $H^+$, $H_2^+$, and $H_3^+$, is generated at a proportion of only about 7%. On the other hand, in the case of the ion source from which the data shown in FIG. 9 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 9 is generated and a single-crystal silicon substrate is irradiated with the generated ion species without any mass separation being performed, the surface of the single-crystal silicon substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^-$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 11:
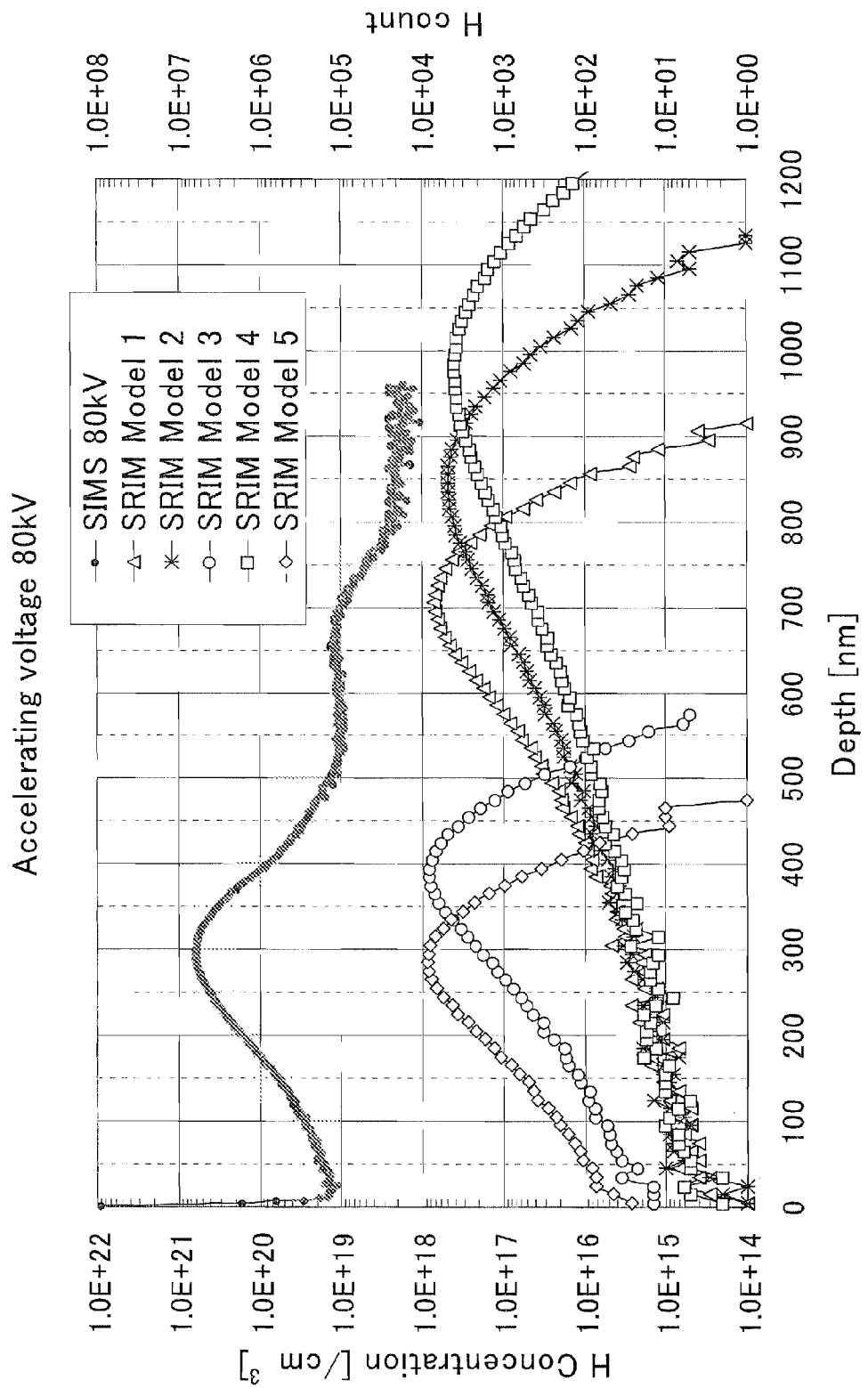
FIG. 11 is a graph showing a profile (actual measured values, calculated values, and fitting functions) of elemental hydrogen in the depth direction when the accelerating voltage is set to 80 kV.

FIG. 11 shows the calculation results obtained when irradiation with the hydrogen ion species (irradiation with 100,000 atoms for H) is performed using Models 1 to 5. FIG. 11 also shows the hydrogen concentration (secondary ion mass spectrometry (SIMS) data) in an Si substrate irradiated with the hydrogen ion species of FIG. 9. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is approximately several kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 12:
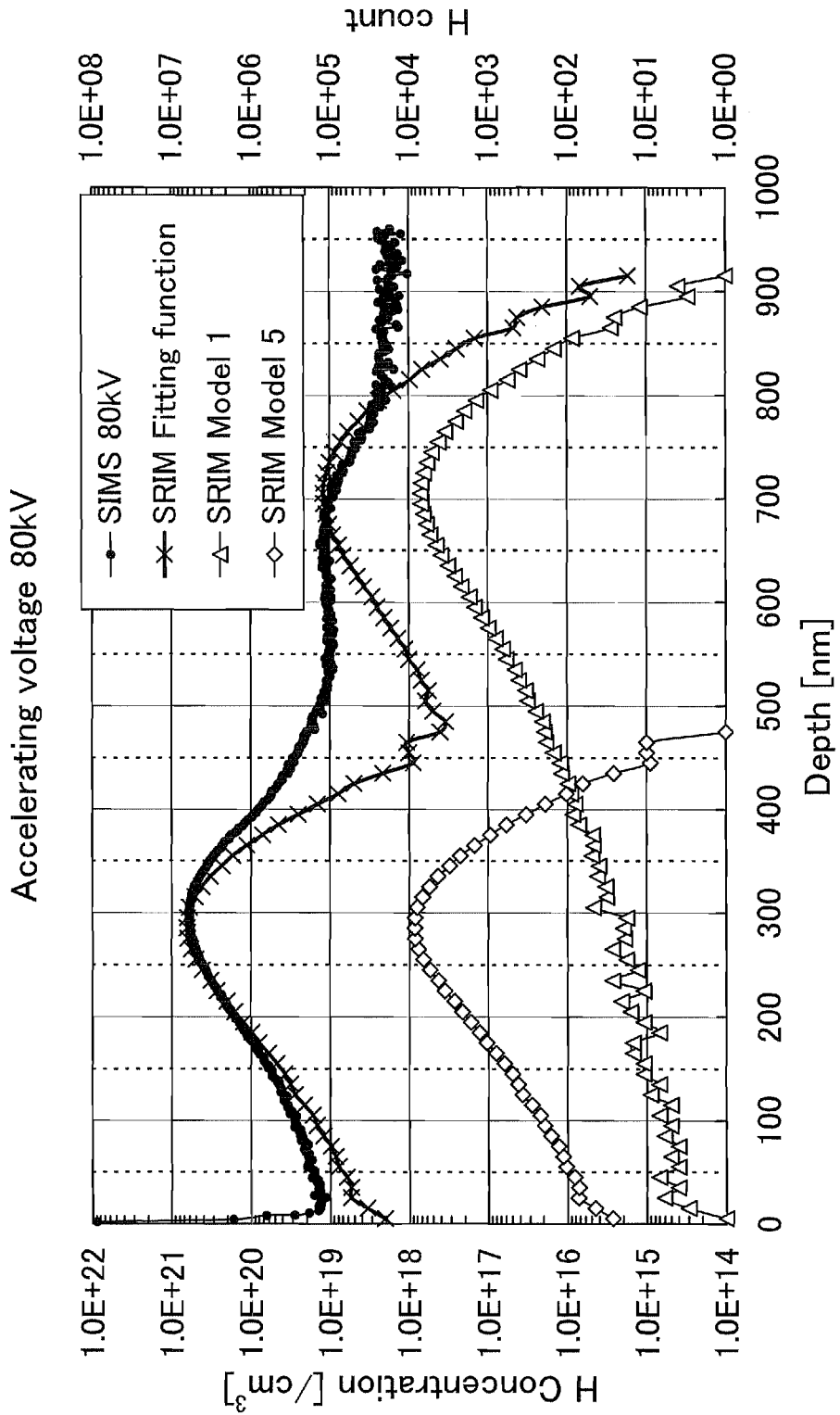
FIG. 12 is a graph showing a profile (actual measured values, calculated values, and fitting functions) of elemental hydrogen in the depth direction when the accelerating voltage is set to 80 kV.
Figure 13:
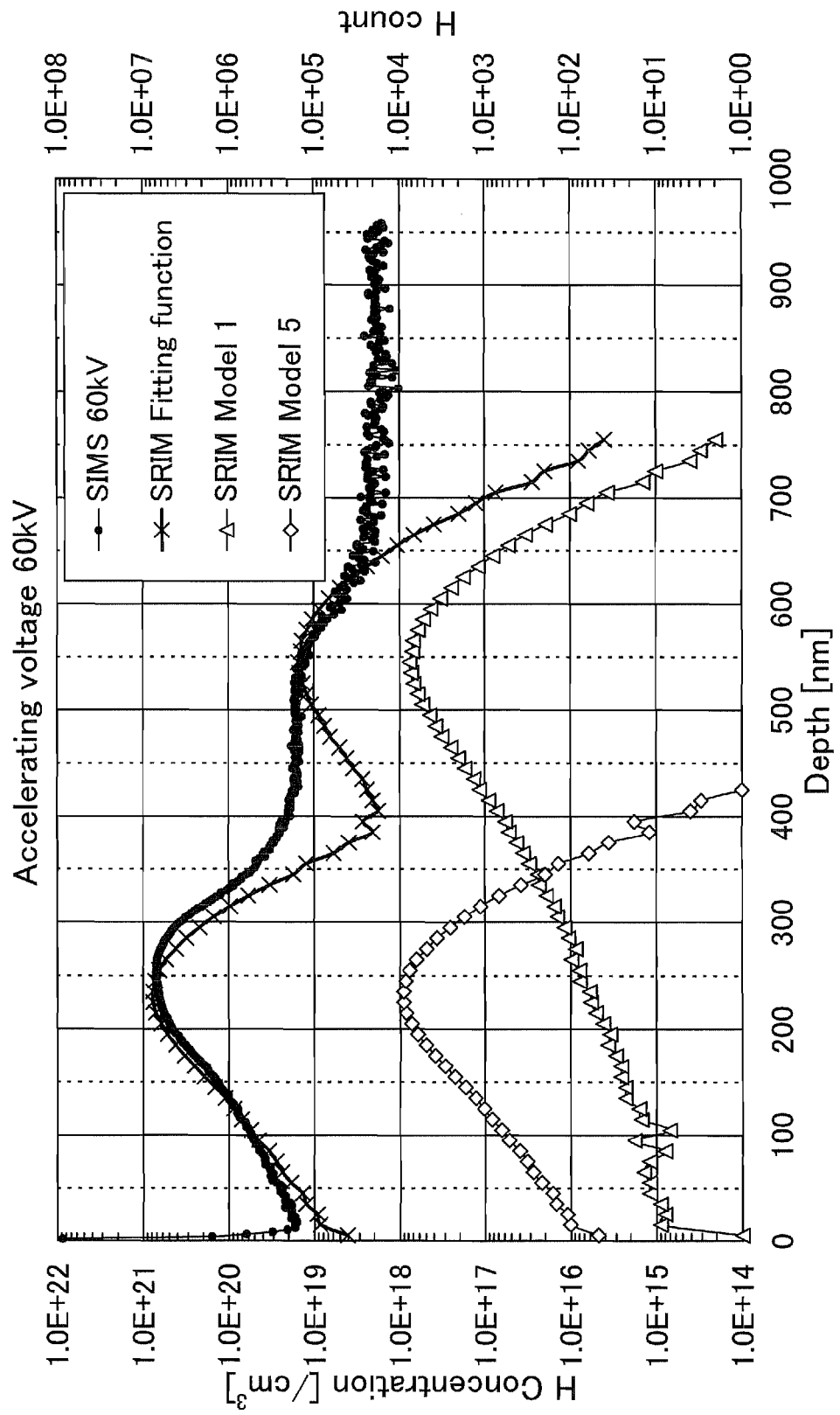
FIG. 13 is a graph showing a profile (actual measured values, calculated values, and fitting functions) of elemental hydrogen in the depth direction when the accelerating voltage is set to 60 kV.
Figure 14:
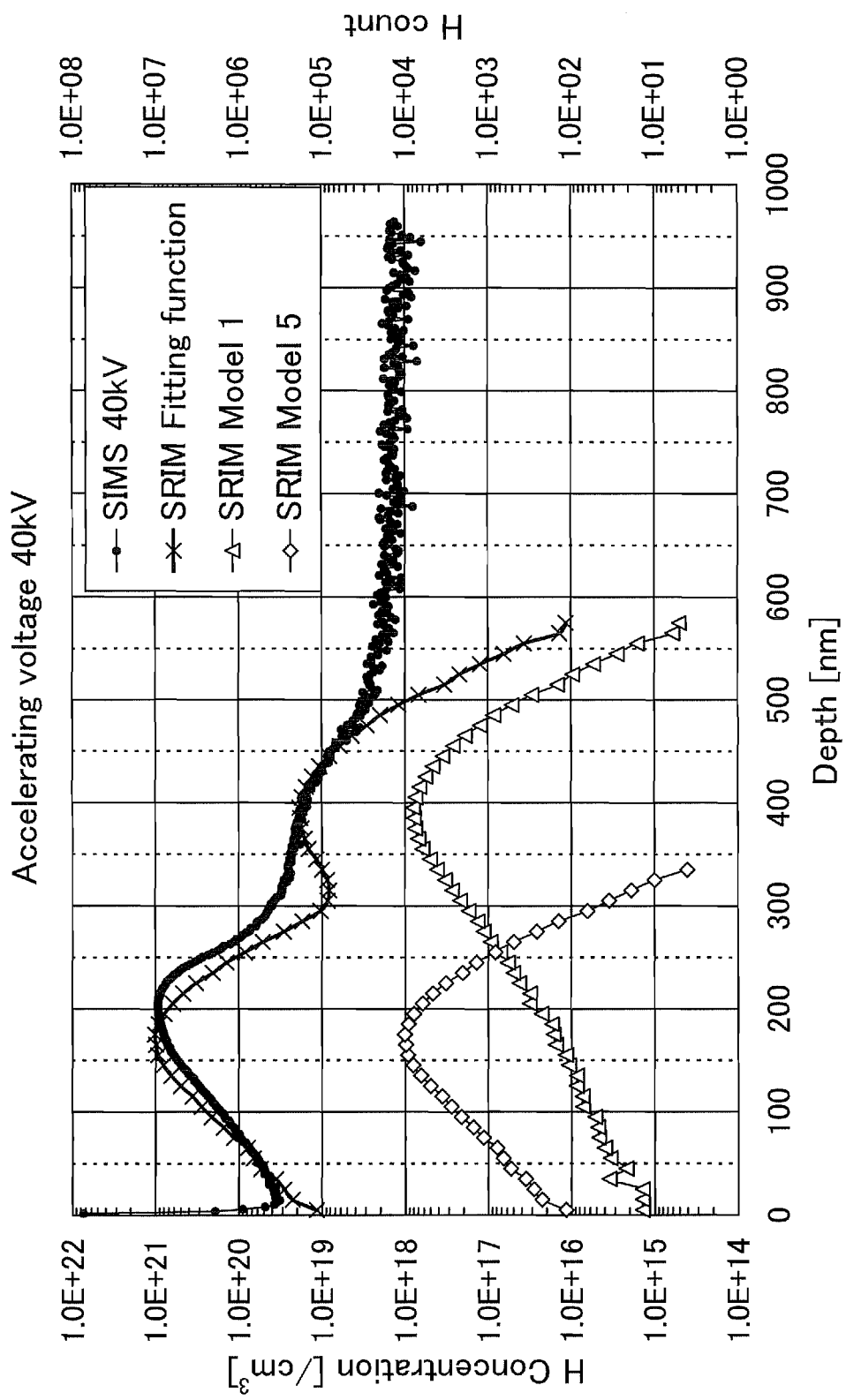
FIG. 14 is a graph showing a profile (actual measured values, calculated values, and fitting functions) of elemental hydrogen in the depth direction when the accelerating voltage is set to 40 kV.

Accordingly, Models 2 to 4 will not be considered hereinafter. FIG. 12 to FIG. 14 each show the calculation results obtained when irradiation with the hydrogen ion species (irradiation with 100,000 atoms for H) is performed using Models 1 and 5. FIG. 12 to FIG. 14 also each show the hydrogen concentration (SIMS data) in an Si substrate irradiated with the hydrogen ion species of FIG. 9, and the simulation results fitted to the SIMS data (hereinafter referred to as a fitting function). Here, FIG. 12 shows the case where the accelerating voltage is 80 kV; FIG. 13, the case where the accelerating voltage is 60 kV; and FIG. 14, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 15 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Using $H_3^+$ Ions)

A plurality of benefits resulting from $H_3^+$ can be enjoyed by irradiation of a substrate with hydrogen ion species with a higher proportion of $H_3^+$ as shown in FIG. 9. For example, because $H_3^+$ splits into $H^+$, H, or the like to be introduced into a substrate, ion introduction efficiency can be improved compared with the case of irradiation mainly with $H^+$ or $H_2^+$. This leads to an improvement in silicon substrate production efficiency. In addition, because the kinetic energy of $H^+$ or H after $H_3^+$ splits similarly tends to be low, $H_3^+$ is suitable for manufacture of thin silicon films.

Note that, in this specification, a method is described in which an ion doping apparatus that is capable of irradiation with the hydrogen ion species as shown in FIG. 9 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an increase in area, a reduction in costs, and an improvement in production efficiency can be obtained. On the other hand, if first priority is given to irradiation with $H_3^+$, there is no need to interpret the present invention as being limited to the use of an ion doping apparatus.

This application is based on Japanese Patent Application serial no. 2007-115993 filed with the Japan Patent Office on Apr. 25, 2007, the entire contents of which are hereby incorporated by reference.

What is claimed is:

1. A method of manufacturing a semiconductor device comprising the steps of:
    forming a first insulating film on a first substrate, wherein the first substrate comprises single-crystal semiconductor;
    introducing ions comprising $H_3^+$ ions into the first substrate to form an embrittled layer therein;
    forming a second insulating film and a third insulating film in order over a second substrate;
    irradiating both of a surface of the first insulating film and a surface of the third insulating film with a beam in a vacuum, whereby both of the surface of the first insulating film and the surface of the third insulating film are etched and activated;
    bonding the first insulating film on the first substrate and the third insulating film over the second substrate together after the step of irradiating; and
    forming a single-crystal semiconductor film over the second substrate by separating the single-crystal semiconductor film from the first substrate at an interface of the embrittled layer in the first substrate,
    wherein a material of the first insulating film is the same as that of the third insulating film.

2. The method of manufacturing a semiconductor device according to claim 1, wherein each of the first insulating film and the third insulating film comprises silicon oxide that contains nitrogen, and the second insulating film comprises silicon nitride that contains oxygen.

3. The method of manufacturing a semiconductor device according to claim 1, wherein the second substrate comprises a material selected from glass, plastic, synthetic resin, quartz, and ceramic.

4. The method of manufacturing a semiconductor device according to claim 1, wherein the beam is an argon ion beam.

5. The method of manufacturing a semiconductor device according to claim 1, wherein the beam is an electron beam.

6. The method of manufacturing a semiconductor device according to claim 1, wherein, in the step of introducing, the ions further include $H^+$ ions and $H_2^+$ ions, and
    wherein a proportion of the $H_3^+$ ions is made higher than those of the $H^+$ and $H_2^+$ ions.

7. The method of manufacturing a semiconductor device according to claim 1, wherein the second insulating film is formed by a CVD method, a low-pressure CVD method, or a sputtering method.

8. The method of manufacturing a semiconductor device according to claim 1, further comprising steps of:
    forming a gate insulating film over the single-crystal semiconductor film;
    forming a gate electrode over the gate insulating film;
    introducing an impurity element into the single-crystal semiconductor film using the gate electrode as a mask;
    forming an interlayer insulating film over the gate electrode;
    forming a contact hole in the interlayer insulating film that reaches the single-crystal semiconductor film; and
    forming a conductive film over the interlayer insulating film that is electrically connected to the single-crystal semiconductor film through the contact hole.

9. A method of manufacturing a semiconductor device comprising the steps of:
forming a first insulating film on a first substrate, wherein the first substrate comprises single-crystal semiconductor;
introducing ions comprising $H_3^+$ ions into the first substrate to form an embrittled layer therein;
forming a second insulating film over a second substrate;
irradiating both of a surface of the first insulating film and a surface of the second insulating film with a beam in a vacuum, whereby both of the surface of the first insulating film and the surface of the second insulating film are etched and activated;
bonding the first insulating film on the first substrate and the second insulating film over the second substrate together after the step of irradiating; and
forming a single-crystal semiconductor film over the second substrate by separating the single-crystal semiconductor film from the first substrate at an interface of the embrittled layer in the first substrate,
wherein a material of the first insulating film is the same as that of the second insulating film.

10. The method of manufacturing a semiconductor device according to claim 9, wherein each of the first insulating film and the second insulating film comprises silicon oxide that contains nitrogen.

11. The method of manufacturing a semiconductor device according to claim 9, wherein the second substrate comprises a material selected from glass, plastic, synthetic resin, quartz, and ceramic.

12. The method of manufacturing a semiconductor device according to claim 9, wherein the beam is an argon ion beam.

13. The method of manufacturing a semiconductor device according to claim 9, wherein the beam is an electron beam.

14. The method of manufacturing a semiconductor device according to claim 9, wherein, in the step of introducing, the ions further include $H^+$ ions and $H_2^+$ ions, and
wherein a proportion of the $H_3^+$ ions is made higher than those of the $H^+$ and $H_2^+$ ions.

15. The method of manufacturing a semiconductor device according to claim 9, wherein the first insulating film is formed by a CVD method, a low-pressure CVD method, or a sputtering method.

16. The method of manufacturing a semiconductor device according to claim 9, wherein the second insulating film is formed by a CVD method, a low-pressure CVD method, or a sputtering method.

17. The method of manufacturing a semiconductor device according to claim 9, further comprising steps of:
forming a gate insulating film over the single-crystal semiconductor film;
forming a gate electrode over the gate insulating film;
introducing an impurity element into the single-crystal semiconductor film using the gate electrode as a mask;
forming an interlayer insulating film over the gate electrode;
forming a contact hole in the interlayer insulating film that reaches the single-crystal semiconductor film; and
forming a conductive film over the interlayer insulating film that is electrically connected to the single-crystal semiconductor film through the contact hole.

18. A method of manufacturing a semiconductor device comprising the steps of:
forming a first insulating film on a first substrate, wherein the first substrate comprises single-crystal semiconductor;
introducing ions comprising $H_2^+$ ions into the first substrate to form an embrittled layer therein;
forming a second insulating film and a third insulating film in order over a second substrate;
irradiating both of a surface of the first insulating film and a surface of the third insulating film with a beam in a vacuum, whereby both of the surface of the first insulating film and the surface of the third insulating film are etched and activated;
bonding the first insulating film on the first substrate and the third insulating film over the second substrate after the step of irradiating; and
forming a single-crystal semiconductor film over the second substrate by separating the single-crystal semiconductor film from the first substrate at an interface of the embrittled layer in the first substrate,
wherein a material of the first insulating film is the same as that of the third insulating film.

19. The method of manufacturing a semiconductor device according to claim 18, wherein each of the first insulating film and the third insulating film comprises silicon oxide that contains nitrogen, and the second insulating film comprises silicon nitride that contains oxygen.

20. The method of manufacturing a semiconductor device according to claim 18, wherein the second substrate comprises a material selected from glass, plastic, synthetic resin, quartz, and ceramic.

21. The method of manufacturing a semiconductor device according to claim 18, wherein the beam is an argon ion beam.

22. The method of manufacturing a semiconductor device according to claim 18, wherein the beam is an electron beam.

23. The method of manufacturing a semiconductor device according to claim 18, wherein, in the step of introducing, the ions further include $H^+$ ions and $H_3^+$ ions, and
wherein a percentage of the $H_2^+$ ions in the total amount of the $H^+$, $H_2^+$, and $H_3^+$ ions is greater than or substantially equal to 56%.

24. The method of manufacturing a semiconductor device according to claim 18, wherein the first insulating film is formed by a CVD method, a low-pressure CVD method, or a sputtering method.

25. The method of manufacturing a semiconductor device according to claim 18, wherein the second insulating film is formed by a CVD method, a low-pressure CVD method, or a sputtering method.

26. The method of manufacturing a semiconductor device according to claim 18, further comprising steps of:
forming a gate insulating film over the single-crystal semiconductor film;
forming a gate electrode over the gate insulating film;
introducing an impurity element into the single-crystal semiconductor film using the gate electrode as a mask;
forming an interlayer insulating film over the gate electrode;
forming a contact hole in the interlayer insulating film that reaches the single-crystal semiconductor film; and
forming a conductive film over the interlayer insulating film that is electrically connected to the single-crystal semiconductor film through the contact hole.

27. A method of manufacturing a semiconductor device comprising the steps of:
forming a first insulating film on a first substrate, wherein the first substrate comprises single-crystal semiconductor;
introducing ions comprising $H_2^+$ ions into the first substrate to form an embrittled layer therein;

forming a second insulating film over a second substrate;

irradiating both of a surface of the first insulating film and a surface of the second insulating film with a beam in a vacuum, whereby both of the surface of the first insulating film and the surface of the second insulating film are etched and activated;

bonding the first insulating film on the first substrate and the second insulating film over the second substrate together after the step of irradiating; and forming a single-crystal semiconductor film over the second substrate by separating the single-crystal semiconductor film from the first substrate at an interface of the embrittled layer in the first substrate, wherein a material of the first insulating film is the same as that of the second insulating film.

28. The method of manufacturing a semiconductor device according to claim 27, wherein each of the first insulating film and the second insulating film comprises silicon oxide that contains nitrogen.

29. The method of manufacturing a semiconductor device according to claim 27, wherein the second substrate comprises a material selected from glass, plastic, synthetic resin, quartz, and ceramic.

30. The method of manufacturing a semiconductor device according to claim 27, wherein the beam is an argon ion beam.

31. The method of manufacturing a semiconductor device according to claim 27, wherein the beam is an electron beam.

32. The method of manufacturing a semiconductor device according to claim 27, wherein, in the step of introducing, the ions further include $H^+$ ions and $H_3^+$ ions, and wherein a percentage of the $H_2^+$ ions in the total amount of the $H^+$, $H_2^+$, and $H_3^+$ ions is greater than or substantially equal to 56%.

33. The method of manufacturing a semiconductor device according to claim 1, wherein the first insulating film is formed by a CVD method, a low-pressure CVD method, or a sputtering method.

34. The method of manufacturing a semiconductor device according to claim 27, wherein the first insulating film is formed by a CVD method, a low-pressure CVD method, or a sputtering method.

35. The method of manufacturing a semiconductor device according to claim 27, wherein the second insulating film is formed by a CVD method, a low-pressure CVD method, or a sputtering method.

36. The method of manufacturing a semiconductor device according to claim 27, further comprising steps of:

forming a gate insulating film over the single-crystal semiconductor film;

forming a gate electrode over the gate insulating film;

introducing an impurity element into the single-crystal semiconductor film using the gate electrode as a mask;

forming an interlayer insulating film over the gate electrode;

forming a contact hole in the interlayer insulating film that reaches the single-crystal semiconductor film; and forming a conductive film over the interlayer insulating film that is electrically connected to the single-crystal semiconductor film through the contact hole.

* * * * *

UNITED STATES PATENT AND TRADEMARK OFFICE
CERTIFICATE OF CORRECTION

PATENT NO.       : 8,557,676 B2                                Page 1 of 1
APPLICATION NO.  : 12/986582
DATED            : October 15, 2013
INVENTOR(S)      : Shunpei Yamazaki et al.

It is certified that error appears in the above-identified patent and that said Letters Patent is hereby corrected as shown below:

In the Specification

At column 12, line 27, "Rained" should be --formed--;

At column 15, line 56, "fowled" should be --formed--;

At column 16, line 22, "foamed" should be --formed--;

At column 17, line 60, "fouled" should be --formed--;

At column 19, line 25, "SOT" should be --SOI--;

At column 22, line 29, "$H_2^-$" should be --$H_2^+$--.

Signed and Sealed this
Eighteenth Day of February, 2014

Michelle K. Lee
*Deputy Director of the United States Patent and Trademark Office*